US012757806B2

(12) United States Patent
Suwito et al.

(10) Patent No.: US 12,757,806 B2
(45) Date of Patent: Oct. 6, 2026

(54) RAPID THERMAL PROCESSING FOR DIRECT BONDING

(71) Applicant: ADEIA SEMICONDUCTOR BONDING TECHNOLOGIES INC., San Jose, CA (US)

(72) Inventors: Dominik Suwito, San Jose, CA (US); Thomas Workman, San Jose, CA (US); Rajesh Katkar, Milpitas, CA (US); Laura Wills Mirkarimi, Sunol, CA (US)

(73) Assignee: Adeia Semiconductor Bonding Technologies Inc., San Jose, CA (US)

( * ) Notice: Subject to any disclaimer, the term of this patent is extended or adjusted under 35 U.S.C. 154(b) by 379 days.

(21) Appl. No.: 18/461,290

(22) Filed: Sep. 5, 2023

(65) Prior Publication Data

US 2024/0079376 A1 Mar. 7, 2024

Related U.S. Application Data

(60) Provisional application No. 63/374,881, filed on Sep. 7, 2022.

(51) Int. Cl.
*H10W 99/00* (2026.01)
*H10W 72/00* (2026.01)
(Continued)

(52) U.S. Cl.
CPC ........... *H10W 99/00* (2026.01); *H10W 72/90* (2026.01); *H10W 72/019* (2026.01);
(Continued)

(58) Field of Classification Search
None
See application file for complete search history.

(56) References Cited

U.S. PATENT DOCUMENTS 3,175,025 A 3/1965 Geen et al.
3,423,823 A 1/1969 Ansley
(Continued)

FOREIGN PATENT DOCUMENTS

CN 102412122 A 4/2012
CN 102762690 A 10/2012
(Continued)

OTHER PUBLICATIONS

Amirfeiz et al., "Formation of silicon structures by plasma-activated wafer bonding," Journal of The Electrochemical Society, 2000, vol. 147, No. 7, pp. 2693-2698.
(Continued)

*Primary Examiner* — Michael Lebentritt
(74) *Attorney, Agent, or Firm* — Knobbe, Martens Olson & Bear, LLP

(57) ABSTRACT

Bonded structures and methods of direct hybrid bonding are disclosed. Non-conductive regions of two elements, such as dies or wafers, are first bonded together to form a bonded structure. Aligned conductive regions of the bonded structure, such as metal pads or traces, are then annealed to expand and bridge a gap between them. The anneal includes rapid thermal processing (RTP), such as with radiant heating. The bond interface between the first and second conductive features includes rapid growth structure(s) indicative of the inclusion of RTP in the anneal. Additional non-RTP anneal phases can also be employed.

20 Claims, 19 Drawing Sheets

(51) Int. Cl.
*H10W 72/90* (2026.01)
*H10W 80/00* (2026.01)
*H10W 90/00* (2026.01)

(52) U.S. Cl.
CPC ........ *H10W 80/312* (2026.01); *H10W 80/327* (2026.01); *H10W 90/792* (2026.01)

(56) References Cited

U.S. PATENT DOCUMENTS

| | | | |
|---|---|---|---|
| 4,612,083 A | 9/1986 | Yasumoto et al. | |
| 4,818,728 A | 4/1989 | Rai et al. | |
| 5,451,547 A | 9/1995 | Himi et al. | |
| 5,492,859 A | 2/1996 | Sakaguchi et al. | |
| 5,668,057 A | 9/1997 | Eda et al. | |
| 5,747,857 A | 5/1998 | Eda et al. | |
| 5,753,536 A | 5/1998 | Sugiyama et al. | |
| 5,771,555 A | 6/1998 | Eda et al. | |
| 5,773,836 A | 6/1998 | Harley | |
| 5,877,070 A | 3/1999 | Goesele | |
| 5,880,010 A | 3/1999 | Davidson | |
| 6,080,640 A | 6/2000 | Gardner et al. | |
| 6,180,496 B1 | 1/2001 | Farrens et al. | |
| 6,423,640 B1 | 7/2002 | Lee et al. | |
| 6,465,892 B1 | 10/2002 | Suga | |
| 6,495,398 B1 | 12/2002 | Goetz | |
| 6,502,271 B1 | 1/2003 | Epshteyn | |
| 6,645,828 B1 | 11/2003 | Farrens et al. | |
| 6,762,076 B2 | 7/2004 | Kim et al. | |
| 6,877,209 B1 | 4/2005 | Miller et al. | |
| 6,878,909 B2 * | 4/2005 | Bergstrom | H05B 6/105 219/635 |
| 6,887,769 B2 | 5/2005 | Kellar et al. | |
| 6,908,027 B2 | 6/2005 | Tolchinsky et al. | |
| 6,908,832 B2 | 6/2005 | Farrens et al. | |
| 7,037,804 B2 | 5/2006 | Kellar et al. | |
| 7,045,453 B2 | 5/2006 | Canaperi et al. | |
| 7,105,980 B2 | 9/2006 | Abbott et al. | |
| 7,109,092 B2 | 9/2006 | Tong | |
| 7,126,212 B2 | 10/2006 | Enquist et al. | |
| 7,157,787 B2 | 1/2007 | Kim et al. | |
| 7,192,841 B2 | 3/2007 | Wei et al. | |
| 7,193,423 B1 | 3/2007 | Dalton et al. | |
| 7,213,314 B2 | 5/2007 | Abbott et al. | |
| 7,230,512 B1 | 6/2007 | Carpenter et al. | |
| 7,335,572 B2 | 2/2008 | Tong et al. | |
| 7,466,022 B2 | 12/2008 | Miller et al. | |
| 7,602,070 B2 | 10/2009 | Tong et al. | |
| 7,683,459 B2 | 3/2010 | Ma | |
| 7,750,488 B2 | 7/2010 | Patti et al. | |
| 7,759,220 B2 | 7/2010 | Henley | |
| 7,803,693 B2 | 9/2010 | Trezza | |
| 7,862,885 B2 * | 1/2011 | Tong | H01L 24/29 428/457 |
| 8,034,713 B2 | 10/2011 | Dunne | |
| 8,035,464 B1 | 10/2011 | Abbott et al. | |
| 8,183,127 B2 | 5/2012 | Patti et al. | |
| 8,349,635 B1 | 1/2013 | Gan et al. | |
| 8,377,798 B2 | 2/2013 | Peng et al. | |
| 8,431,436 B1 | 4/2013 | Nguyen | |
| 8,441,131 B2 | 5/2013 | Ryan | |
| 8,476,165 B2 | 7/2013 | Trickett et al. | |
| 8,482,132 B2 | 7/2013 | Yang et al. | |
| 8,501,537 B2 | 8/2013 | Sadaka et al. | |
| 8,524,533 B2 | 9/2013 | Tong et al. | |
| 8,620,164 B2 | 12/2013 | Heck et al. | |
| 8,647,987 B2 | 2/2014 | Yang et al. | |
| 8,686,570 B2 | 4/2014 | Semmelmeyer et al. | |
| 8,697,493 B2 | 4/2014 | Sadaka | |
| 8,716,105 B2 | 5/2014 | Sadaka et al. | |
| 8,735,219 B2 | 5/2014 | Enquist et al. | |
| 8,802,538 B1 | 8/2014 | Liu | |
| 8,809,123 B2 | 8/2014 | Liu et al. | |
| 8,975,158 B2 | 3/2015 | Plach et al. | |
| 8,988,299 B2 | 3/2015 | Kam et al. | |
| 9,093,350 B2 | 7/2015 | Endo et al. | |
| 9,142,517 B2 | 9/2015 | Liu et al. | |
| 9,147,650 B2 | 9/2015 | Hagimoto et al. | |
| 9,171,756 B2 | 10/2015 | Enquist et al. | |
| 9,184,125 B2 | 11/2015 | Enquist et al. | |
| 9,224,704 B2 | 12/2015 | Landru | |
| 9,230,941 B2 | 1/2016 | Chen et al. | |
| 9,257,399 B2 | 2/2016 | Kuang et al. | |
| 9,287,351 B2 | 3/2016 | Kitada et al. | |
| 9,299,736 B2 | 3/2016 | Chen et al. | |
| 9,312,229 B2 | 4/2016 | Chen et al. | |
| 9,331,149 B2 | 5/2016 | Tong et al. | |
| 9,337,235 B2 | 5/2016 | Chen et al. | |
| 9,368,866 B2 | 6/2016 | Yu | |
| 9,385,024 B2 | 7/2016 | Tong et al. | |
| 9,394,161 B2 | 7/2016 | Cheng et al. | |
| 9,437,572 B2 | 9/2016 | Chen et al. | |
| 9,443,796 B2 | 9/2016 | Chou et al. | |
| 9,461,007 B2 | 10/2016 | Chun et al. | |
| 9,496,239 B1 | 11/2016 | Edelstein et al. | |
| 9,536,848 B2 | 1/2017 | England et al. | |
| 9,559,081 B1 | 1/2017 | Lai et al. | |
| 9,620,481 B2 | 4/2017 | Edelstein et al. | |
| 9,656,852 B2 | 5/2017 | Cheng et al. | |
| 9,698,126 B2 | 7/2017 | Enquist et al. | |
| 9,723,716 B2 | 8/2017 | Meinhold | |
| 9,728,521 B2 | 8/2017 | Tsai et al. | |
| 9,741,620 B2 | 8/2017 | Uzoh et al. | |
| 9,799,587 B2 | 10/2017 | Fujii et al. | |
| 9,852,988 B2 | 12/2017 | Enquist et al. | |
| 9,881,882 B2 | 1/2018 | Hsu et al. | |
| 9,893,004 B2 | 2/2018 | Yazdani | |
| 9,899,442 B2 | 2/2018 | Katkar | |
| 9,929,050 B2 | 3/2018 | Lin | |
| 9,941,241 B2 | 4/2018 | Edelstein et al. | |
| 9,941,243 B2 | 4/2018 | Kim et al. | |
| 9,953,941 B2 | 4/2018 | Enquist | |
| 9,960,142 B2 | 5/2018 | Chen et al. | |
| 10,002,844 B1 | 6/2018 | Wang et al. | |
| 10,026,605 B2 | 7/2018 | Doub et al. | |
| 10,075,657 B2 | 9/2018 | Fahim et al. | |
| 10,177,735 B2 | 1/2019 | Ruby et al. | |
| 10,204,893 B2 | 2/2019 | Uzoh et al. | |
| 10,269,756 B2 | 4/2019 | Uzoh | |
| 10,276,619 B2 | 4/2019 | Kao et al. | |
| 10,276,909 B2 | 4/2019 | Huang et al. | |
| 10,418,277 B2 | 9/2019 | Cheng et al. | |
| 10,446,456 B2 | 10/2019 | Shen et al. | |
| 10,446,487 B2 | 10/2019 | Huang et al. | |
| 10,446,532 B2 | 10/2019 | Uzoh et al. | |
| 10,454,447 B2 | 10/2019 | Solal et al. | |
| 10,508,030 B2 | 12/2019 | Katkar et al. | |
| 10,522,499 B2 | 12/2019 | Enquist et al. | |
| 10,707,087 B2 | 7/2020 | Uzoh et al. | |
| 10,727,219 B2 | 7/2020 | Uzoh et al. | |
| 10,784,191 B2 | 9/2020 | Huang et al. | |
| 10,790,262 B2 | 9/2020 | Uzoh et al. | |
| 10,840,135 B2 | 11/2020 | Uzoh | |
| 10,840,205 B2 | 11/2020 | Fountain, Jr. et al. | |
| 10,854,578 B2 | 12/2020 | Morein | |
| 10,879,212 B2 | 12/2020 | Uzoh et al. | |
| 10,886,177 B2 | 1/2021 | DeLaCruz et al. | |
| 10,892,246 B2 | 1/2021 | Uzoh | |
| 10,923,408 B2 | 2/2021 | Huang et al. | |
| 10,923,413 B2 | 2/2021 | DeLaCruz | |
| 10,950,547 B2 | 3/2021 | Mohammed et al. | |
| 10,964,664 B2 | 3/2021 | Mandalapu et al. | |
| 10,985,133 B2 | 4/2021 | Uzoh | |
| 10,991,804 B2 | 4/2021 | DeLaCruz et al. | |
| 10,998,292 B2 | 5/2021 | Lee et al. | |
| 11,011,494 B2 | 5/2021 | Gao et al. | |
| 11,011,503 B2 | 5/2021 | Wang et al. | |
| 11,031,285 B2 | 6/2021 | Katkar et al. | |
| 11,037,919 B2 | 6/2021 | Uzoh et al. | |
| 11,056,348 B2 | 7/2021 | Theil | |
| 11,069,734 B2 | 7/2021 | Katkar | |
| 11,088,099 B2 | 8/2021 | Katkar et al. | |
| 11,127,738 B2 | 9/2021 | DeLaCruz et al. | |
| 11,158,606 B2 | 10/2021 | Gao et al. | |

(56) References Cited

U.S. PATENT DOCUMENTS

| | | | |
|---|---|---|---|
| 11,171,117 | B2 | 11/2021 | Gao et al. |
| 11,176,450 | B2 | 11/2021 | Teig et al. |
| 11,189,585 | B2 * | 11/2021 | Mueller .............. H01L 25/0657 |
| 11,222,863 | B2 | 1/2022 | Hua et al. |
| 11,256,004 | B2 | 2/2022 | Haba et al. |
| 11,264,357 | B1 | 3/2022 | DeLaCruz et al. |
| 11,276,676 | B2 | 3/2022 | Enquist et al. |
| 11,329,034 | B2 | 5/2022 | Tao et al. |
| 11,348,898 | B2 | 5/2022 | DeLaCruz et al. |
| 11,355,443 | B2 | 6/2022 | Huang et al. |
| 11,424,205 | B2 | 8/2022 | Chen et al. |
| 11,631,586 | B2 | 4/2023 | Enquist et al. |
| 11,664,357 | B2 | 5/2023 | Fountain, Jr. et al. |
| 12,199,069 | B2 | 1/2025 | Enquist et al. |
| 12,438,129 | B2 | 10/2025 | Enquist et al. |
| 2001/0037995 | A1 | 11/2001 | Akatsu et al. |
| 2001/0053607 | A1 | 12/2001 | Sakaguchi et al. |
| 2002/0030198 | A1 | 3/2002 | Coman et al. |
| 2002/0048900 | A1 | 4/2002 | Lo et al. |
| 2002/0068396 | A1 | 6/2002 | Fitzergald |
| 2003/0022412 | A1 | 1/2003 | Higgins et al. |
| 2003/0030119 | A1 | 2/2003 | Higgins, Jr. et al. |
| 2004/0084414 | A1 | 5/2004 | Sakai et al. |
| 2006/0057945 | A1 | 3/2006 | Hsu et al. |
| 2006/0076559 | A1 | 4/2006 | Faure et al. |
| 2006/0121696 | A1 | 6/2006 | Shiota et al. |
| 2006/0138907 | A1 | 6/2006 | Koizumi et al. |
| 2006/0199353 | A1 | 9/2006 | Kub et al. |
| 2006/0255341 | A1 | 11/2006 | Pinnington et al. |
| 2006/0273068 | A1 | 12/2006 | Maunand Tussot et al. |
| 2006/0284167 | A1 | 12/2006 | Augustine et al. |
| 2006/0292823 | A1 | 12/2006 | Ramanathan et al. |
| 2007/0096294 | A1 | 5/2007 | Ikeda et al. |
| 2007/0111386 | A1 | 5/2007 | Kim et al. |
| 2007/0222048 | A1 | 9/2007 | Huang |
| 2007/0295456 | A1 | 12/2007 | Gudeman et al. |
| 2008/0061291 | A1 | 3/2008 | Dusa et al. |
| 2008/0254560 | A1 | 10/2008 | Yamazaki |
| 2009/0004822 | A1 | 1/2009 | Murakami et al. |
| 2009/0042356 | A1 | 2/2009 | Takayama et al. |
| 2009/0068831 | A1 | 3/2009 | Enquist et al. |
| 2009/0191719 | A1 | 7/2009 | Dupont |
| 2009/0321869 | A1 | 12/2009 | Fukuoka et al. |
| 2011/0053339 | A1 | 3/2011 | Ozawa |
| 2011/0128399 | A1 | 6/2011 | Fujii |
| 2011/0129986 | A1 | 6/2011 | Libralesso et al. |
| 2011/0253987 | A1 | 10/2011 | Chung et al. |
| 2011/0290552 | A1 | 12/2011 | Palmateer et al. |
| 2012/0003813 | A1 | 1/2012 | Chuang et al. |
| 2012/0013013 | A1 | 1/2012 | Sadaka et al. |
| 2012/0028440 | A1 | 2/2012 | Castex et al. |
| 2012/0077329 | A1 | 3/2012 | Broekaart et al. |
| 2012/0119224 | A1 | 5/2012 | Tai et al. |
| 2012/0132922 | A1 | 5/2012 | Arena et al. |
| 2012/0168792 | A1 | 7/2012 | Kang et al. |
| 2012/0183808 | A1 | 7/2012 | Tong |
| 2012/0212384 | A1 | 8/2012 | Kam et al. |
| 2012/0270231 | A1 | 10/2012 | Smith et al. |
| 2013/0130473 | A1 | 5/2013 | Ben Mohamed et al. |
| 2013/0207271 | A1 | 8/2013 | Hagimoto |
| 2013/0228775 | A1 | 9/2013 | Noda et al. |
| 2014/0054598 | A1 | 2/2014 | Shim |
| 2014/0167230 | A1 | 6/2014 | Kitada et al. |
| 2014/0175655 | A1 | 6/2014 | Chen et al. |
| 2014/0225795 | A1 | 8/2014 | Yu |
| 2015/0064498 | A1 | 3/2015 | Tong |
| 2015/0097022 | A1 | 4/2015 | Di Cioccio et al. |
| 2016/0049384 | A1 | 2/2016 | Lu et al. |
| 2016/0181228 | A1 | 6/2016 | Higuchi et al. |
| 2016/0300912 | A1 | 10/2016 | Tanaka et al. |
| 2016/0343682 | A1 | 11/2016 | Kawasaki |
| 2017/0036419 | A1 | 2/2017 | Adib et al. |
| 2017/0194271 | A1 | 7/2017 | Hsu et al. |
| 2017/0221786 | A1 | 8/2017 | Konishi et al. |
| 2017/0226640 | A1 | 8/2017 | Mikijelj et al. |
| 2017/0338143 | A1 | 11/2017 | Peidous et al. |
| 2018/0068965 | A1 | 3/2018 | Chen et al. |
| 2018/0175012 | A1 | 6/2018 | Wu et al. |
| 2018/0182639 | A1 | 6/2018 | Uzoh et al. |
| 2018/0182666 | A1 | 6/2018 | Uzoh et al. |
| 2018/0190580 | A1 | 7/2018 | Haba et al. |
| 2018/0190583 | A1 | 7/2018 | DeLaCruz et al. |
| 2018/0219038 | A1 | 8/2018 | Gambino et al. |
| 2018/0323177 | A1 | 11/2018 | Yu et al. |
| 2018/0323227 | A1 | 11/2018 | Zhang et al. |
| 2018/0331066 | A1 | 11/2018 | Uzoh et al. |
| 2019/0096741 | A1 | 3/2019 | Uzoh et al. |
| 2019/0115277 | A1 | 4/2019 | Yu et al. |
| 2019/0123709 | A1 | 4/2019 | Inoue et al. |
| 2019/0131277 | A1 | 5/2019 | Yang et al. |
| 2019/0157333 | A1 | 5/2019 | Tsai |
| 2019/0164919 | A1 | 5/2019 | Hu et al. |
| 2019/0170631 | A1 | 6/2019 | Shachar et al. |
| 2019/0198362 | A1 | 6/2019 | Lindner |
| 2019/0198409 | A1 | 6/2019 | Katkar et al. |
| 2019/0221607 | A1 | 7/2019 | Gudeman |
| 2019/0265411 | A1 | 8/2019 | Huang et al. |
| 2019/0288660 | A1 | 9/2019 | Goto et al. |
| 2019/0295883 | A1 | 9/2019 | Yokokawa |
| 2019/0319007 | A1 * | 10/2019 | Uzoh ...................... H01L 24/80 |
| 2019/0333550 | A1 | 10/2019 | Fisch |
| 2019/0348336 | A1 | 11/2019 | Katkar et al. |
| 2019/0385935 | A1 | 12/2019 | Gao et al. |
| 2019/0385966 | A1 | 12/2019 | Gao et al. |
| 2020/0006145 | A1 | 1/2020 | Li et al. |
| 2020/0006266 | A1 | 1/2020 | Chen et al. |
| 2020/0013637 | A1 | 1/2020 | Haba |
| 2020/0013765 | A1 | 1/2020 | Fountain, Jr. et al. |
| 2020/0028486 | A1 | 1/2020 | Kishino et al. |
| 2020/0035641 | A1 | 1/2020 | Fountain, Jr. et al. |
| 2020/0075520 | A1 | 3/2020 | Gao et al. |
| 2020/0075534 | A1 | 3/2020 | Gao et al. |
| 2020/0075553 | A1 | 3/2020 | DeLaCruz et al. |
| 2020/0118973 | A1 | 4/2020 | Wang et al. |
| 2020/0126906 | A1 | 4/2020 | Uzoh et al. |
| 2020/0194396 | A1 | 6/2020 | Uzoh |
| 2020/0227367 | A1 | 7/2020 | Haba et al. |
| 2020/0243380 | A1 | 7/2020 | Uzoh et al. |
| 2020/0279821 | A1 | 9/2020 | Haba et al. |
| 2020/0294908 | A1 | 9/2020 | Haba et al. |
| 2020/0328162 | A1 | 10/2020 | Haba et al. |
| 2020/0328164 | A1 | 10/2020 | DeLaCruz et al. |
| 2020/0328165 | A1 | 10/2020 | DeLaCruz et al. |
| 2020/0328193 | A1 | 10/2020 | Enquist et al. |
| 2020/0335408 | A1 | 10/2020 | Gao et al. |
| 2020/0365593 | A1 | 11/2020 | Chen et al. |
| 2020/0371154 | A1 | 11/2020 | DeLaCruz et al. |
| 2020/0395321 | A1 | 12/2020 | Katkar et al. |
| 2020/0411483 | A1 | 12/2020 | Uzoh et al. |
| 2021/0098412 | A1 | 4/2021 | Haba et al. |
| 2021/0118864 | A1 | 4/2021 | DeLaCruz et al. |
| 2021/0143125 | A1 | 5/2021 | DeLaCruz et al. |
| 2021/0181510 | A1 | 6/2021 | Katkar et al. |
| 2021/0193603 | A1 | 6/2021 | Katkar et al. |
| 2021/0193624 | A1 | 6/2021 | DeLaCruz et al. |
| 2021/0193625 | A1 * | 6/2021 | Katkar ................ H01L 25/0657 |
| 2021/0242152 | A1 | 8/2021 | Fountain, Jr. et al. |
| 2021/0296282 | A1 * | 9/2021 | Gao .................... H01L 25/0657 |
| 2021/0305202 | A1 | 9/2021 | Uzoh et al. |
| 2021/0366820 | A1 | 11/2021 | Uzoh |
| 2021/0407941 | A1 | 12/2021 | Haba |
| 2022/0005784 | A1 * | 1/2022 | Gao .................... H01L 23/5226 |
| 2022/0077063 | A1 | 3/2022 | Haba |
| 2022/0077087 | A1 | 3/2022 | Haba |
| 2022/0139867 | A1 | 5/2022 | Uzoh |
| 2022/0139869 | A1 | 5/2022 | Gao et al. |
| 2022/0208650 | A1 | 6/2022 | Gao et al. |
| 2022/0208702 | A1 | 6/2022 | Uzoh |
| 2022/0208723 | A1 | 6/2022 | Katkar et al. |
| 2022/0246497 | A1 | 8/2022 | Fountain, Jr. et al. |
| 2022/0285303 | A1 | 9/2022 | Mirkarimi et al. |
| 2022/0319901 | A1 | 10/2022 | Suwito et al. |
| 2022/0320035 | A1 | 10/2022 | Uzoh et al. |
| 2022/0320036 | A1 | 10/2022 | Gao et al. |

(56) References Cited

U.S. PATENT DOCUMENTS

2023/0005850 A1 1/2023 Fountain, Jr.
2023/0019869 A1 1/2023 Mirkarimi et al.
2023/0020037 A1* 1/2023 Hsu ..................... H01L 25/0657
2023/0036441 A1 2/2023 Haba et al.
2023/0067677 A1 3/2023 Lee et al.
2023/0069183 A1 3/2023 Haba
2023/0100032 A1 3/2023 Haba et al.
2023/0115122 A1 4/2023 Uzoh et al.
2023/0122531 A1 4/2023 Uzoh
2023/0123423 A1 4/2023 Gao et al.
2023/0125395 A1 4/2023 Gao et al.
2023/0130259 A1 4/2023 Haba et al.
2023/0132632 A1 5/2023 Katkar et al.
2023/0140107 A1* 5/2023 Uzoh .................. H01L 21/6836 228/206
2023/0142680 A1 5/2023 Guevara et al.
2023/0154816 A1 5/2023 Haba et al.
2023/0154828 A1 5/2023 Haba et al.
2023/0187264 A1* 6/2023 Uzoh ................ H01L 21/32051 438/455
2023/0187317 A1 6/2023 Uzoh
2023/0187412 A1 6/2023 Gao et al.
2023/0197453 A1 6/2023 Fountain, Jr. et al.
2023/0197496 A1* 6/2023 Theil ..................... B32B 43/006 438/759
2023/0197559 A1 6/2023 Haba et al.
2023/0197560 A1 6/2023 Katkar et al.
2023/0197655 A1 6/2023 Theil et al.
2023/0207322 A1 6/2023 Enquist et al.
2023/0207402 A1 6/2023 Fountain, Jr. et al.
2023/0207437 A1 6/2023 Haba
2023/0207474 A1 6/2023 Uzoh et al.
2023/0207514 A1 6/2023 Gao et al.
2023/0215836 A1 7/2023 Haba et al.
2023/0245950 A1 8/2023 Haba et al.
2023/0253383 A1 8/2023 Fountain, Jr. et al.
2023/0268300 A1 8/2023 Uzoh et al.
2023/0299029 A1 9/2023 Theil et al.
2023/0343734 A1* 10/2023 Uzoh ...................... H01L 24/08
2023/0360950 A1 11/2023 Gao
2023/0361074 A1 11/2023 Uzoh et al.
2023/0369136 A1 11/2023 Uzoh et al.
2023/0375613 A1 11/2023 Haba et al.
2025/0105139 A1* 3/2025 Sharma ................... H01L 24/08
2025/0372573 A1 12/2025 Gao

FOREIGN PATENT DOCUMENTS

CN 102763044 A 10/2012
CN 102598278 B * 4/2015 ......... H10D 30/6755
CN 105575930 A * 5/2016
EP 0823780 A1 2/1998
EP 0616426 B1 9/1998
EP 0591918 B1 7/1999
EP 1540736 A4 3/2006
EP 3 482 231 B1 9/2022
FR 2 849 268 6/2004
JP 2011-200933 10/2011
JP 2013-33786 2/2013
JP 2018-101663 A 6/2018
JP 2018-160519 10/2018
JP 2023151489 A * 10/2023
JP 7579355 B2 * 11/2024 ....... H01L 21/67092
KR 10-2015-0097798 8/2015
KR 2018-0086501 A 7/2018
KR 20180086601 A 8/2018
KR 10-2018-0114896 10/2018
KR 2020-0002698 A 1/2020
TW 201517175 A 5/2015
TW 201630113 A 8/2016
WO WO 2005/043584 A2 5/2005
WO WO 2006/100444 A1 9/2006
WO WO 2015/191082 A1 12/2015
WO WO 2017/151442 A1 9/2017
WO WO 2019/180922 A1 9/2019
WO WO-2022071329 A1 * 4/2022 ............. H01L 23/29
WO WO-2023195322 A1 * 10/2023 ............. H01L 24/05

OTHER PUBLICATIONS

Bengtsson, S. et al., "Low Temperature Bonding," International Conference on Compliant & Alternative Substrate Technology, Meeting Program & Abstract Book, Sep. 29-23, p. 10.

Bush, Steve, "Electronica: Automotive power modules from On Semi," ElectronicsWeekly.com, indicating an Onsemi AR0820 product was to be demonstrated at a Nov. 2018 trade show, https://www.electronicsweekly.com/news/products/power-supplies/electronica-automotive-power-modules-semi-2018-11/ (published Nov. 8, 2018; downloaded Jul. 26, 2023).

Darling, R.B., "Wafer Bonding," EE-527: Microfabrication, Winter 2013, 32 pages.

Farrens et al., "Chemical Free Room Temperature Wafer to Wafer Direct Bonding", J. Electrochem. Soc., vol. 142, No. 11, Nov. 1995, pp. 3949-3955.

Gan, Qing, "Surface activation enhanced low temperature silicon wafer bonding," Dissertation submitted in partial fulfillment of the requirements for the degree of Doctor of Philosophy, Department of Mechanical Engineering and Materials Science, Duke University, Aug. 4, 2000, 192 pages.

Gösele, U. et al., "Semiconductor Wafer Bonding, a Flexible Approach to Materials Combinations in Microelectronics, Micromechanics and Optoelectronics", 1997 IEEE, pp. 23-32.

International Search Report and Written Opinion issued Feb. 7, 2014 in PCT/US2013/057536 filed Aug. 30, 2013.

International Search Report and Written Opinion mailed Mar. 7, 2019, in International Application No. PCT/US2018/060044, 14 pages.

International Search Report and Written Opinion mailed Apr. 22, 2019 in International Application No. PCT/US2018/064982, 13 pages.

International Search Report and Written Opinion mailed Dec. 27, 2023, in International Application No. PCT/US2023/073474, 12 pages.

Ker, Ming-Dou et al., "Fully process-compatible layout design on bond pad to improve wire bond reliability in CMOS Ics," IEEE Transactions on Components and Packaging Technologies, Jun. 2002, vol. 25, No. 2, pp. 309-316.

Mizumoto et al., Direct wafer bonding and its application to waveguide optical isolators, Department of Electrical and Electronic Engineering, Tokyo Institute of Technology, Materials, ISSN: 1996-1944, www.mdpi.com/journal/materials, Mar. 31, 2012, pp. 985-1004.

Moriceau, H. et al., "Overview of recent direct wafer bonding advances and applications," Advances in Natural Sciences-Nanoscience and Nanotechnology, 2010, 11 pages.

Morrison, Jim et al., "Samsung Galaxy S7 Edge Teardown," Tech Insights (posted Apr. 24, 2016), includes description of hybrid bonded Sony IMX260 dual-pixel sensor, https://www.techinsights.com/blog/samsung-galaxy-s7-edge-teardown, downloaded Jul. 11, 2023, 9 pages.

Nakanishi, H. et al., "Studies on $SiO_2$—$SiO_2$ bonding with hydrofluoric acid. Room temperature and low stress bonding technique for MEMS," Sensors and Actuators, 2000, vol. 79, pp. 237-244.

Oberhammer, J. et al., "Sealing of adhesive bonded devices on wafer level," Sensors and Actuators A, 2004, vol. 110, No. 1-3, pp. 407-412, see pp. 407-412, and Figures 1(a)-1 (I), 6 pages.

Onsemi AR0820 image, cross section of a CMOS image sensor product. The part in the image was shipped on Sep. 16, 2021. Applicant makes no representation that the part in the image is identical to the part identified in the separately submitted reference BUSH, Nov. 8, 2018, ElectronicsWeekly.com ("BUSH article"); however, the imaged part and the part shown in the BUSH article share the part number "ONSEMI AR0820."

Plobi, A. et al., "Wafer direct bonding: tailoring adhesion between brittle materials," Materials Science and Engineering Review Journal, 1999, R25, 88 pages.

(56) References Cited

OTHER PUBLICATIONS

Shen et al., "Structure and magnetic properties of Ce-substituted yttrium iron garnet prepared by conventional sintering techniques," J Supercond, 2017, p. 937.
Sony IMX260 image, a first cross section of Sony product labeled IMX260, showing a hybrid bonded back side illuminated CMOS image sensor with a pad opening for a wire bond. The second image shows a second cross-section with peripheral probe and wire bond pads in the bonded structure. The part in the images was shipped in Apr. 2016. Applicant makes no representation that the part in the images is identical to the part identified in the separately submitted reference Morrison et al. (Tech Insights article dated Apr. 24, 2016), describing and showing a similar sensor product within the Samsung Galaxy S7; however the imaged part and the part shown in the Morrison et al. article share the part name "Sony IMX260 image."
Suga et al., "Combined process for wafer direct bonding by means of the surface activation method," IEEE, 2004, pp. 484-490.
Reiche et al., "The effect of a plasma pretreatment on the Si/Si bonding behaviour," Electrochemical Society Proceedings, 1998, vol. 97-36, pp. 437-444.
Takagi et al., "Room-temperature wafer bonding of Si to LiNbO3, LiTaO3 and Gd3Ga5012 by Ar-beam surface activation," Journal of Micromechanics and Microengineering, 2001, vol. 11, No. 4, p. 348.
Takei et al., "Effects of wafer precleaning and plasma irradiation to wafer surfaces on plasma-assisted surface-activated direct bonding," Japanese Journal of Applied Physics, 2010, vol. 49, pp. 1-3.
Taylor, S. et al., "A review of the plasma oxidation of silicon and its applications," Semicond. Sci. Technol., 1993, vol. 8, pp. 1426-1433.
Vasili et al., "Direct observation of multivalent states and 4 f-3d charge transfer in Ce-doped yttrium iron garnet thin films," Physical Review, 2017, pp. 1-10.
"Wafer Bonding—An Overview," ScienceDirect Topics, Journals & Books, https://www.sciencedirect.com/topics/engineering/wafer-bonding, printed Jun. 27, 2019, 12 pages.
Aixtron, "3D integration unites InP, GaN and silicon CMOS." Compound Semiconductor. Jan.-Feb. 2018; 24(1): 7 pages; downloaded from URL: https://compoundsemiconductor.net/article/104207/3D_Integration_Unites_InP_GaN_And_Sil icon_CMOS on Sep. 10, 2024.
Carter et al., "Wafer-Scale InP/Si CMOS 3d Integration Using Low-Temperature Oxide Bonding". In Compound Semiconductor Week (CSW, Santa Barbara, CA, (2015)), pp. 493-494.
Carter Andrew, "3D Heterogenous Integration of CMOS, InP, and GaN Devices Using Hybrid Wafer Bonding". In 2016 3DASIP Conference Dec. 14, 2016; 25 Pages.
Carter et al., Q-Band InP/CMOS Receiver and Transmitter Beamformer Channels Fabricated by 3D Heterogeneous Integration. In 2017 IEEE MTT-S Intern Microwave Symposium (IMS) Jun. 4, 2017 (pp. 1760-1763).
Carter et al., "Si/InP Heterogeneous Integration Techniques from the Wafer-Scale (Hybrid Wafer Bonding) to the Discrete Transistor (Micro-Transfer Printing)," 2018 IEEE SOI-3D-Subthreshold Microelectronics Technology Unified Conference (S3S), Burlingame, CA, USA, 2018, pp. 1-4, doi: 10.1109/S3S.2018.8640196.
Eibelhuber et al., "Advanced bonding techniques for photonic integrated circuits." In CS Mantech Conference May 19, 2014, Denver, CO—USA; pp. 331-334.
Hichri et al., "Optical run-out correction for improved lithography overlay accuracy for FOWLP applications." In Int Symp Microelectr Oct. 1, 2018 (vol. 2018, No. 1, pp. 000217-000223). International Microelectronics Assembly and Packaging Society.
Manda et al., "High-definition Visible—SWIR InGaAs Image Sensor using Cu-Cu Bonding of III-V to Silicon Wafer," In 2019 IEEE International Electron Devices Meeting (IEDM), Dec. 7, 2019 (p. 16.7.1-4), Doi: 10.1109/IEDM19573.2019.8993432.
Urteaga et al., "CMP Process Development on III-V Substrates for 3D Heterogeneous Integration." CS ManTech. May 1, 2019, 5 pages; downloaded from URL: https://csmantech.org/paper/8-4-cmp-process-development-on-iii-v-substrates-for-3d-heterogeneous-integration/.

* cited by examiner

| Anneal type (Peak Temperature/Time) | Sample Size* | Electrical Yield | Median Res. (Ohm) of Daisy Chains | Mean Res. (Ohm) of Daisy Chains | Stdv (Ohm) |
|---|---|---|---|---|---|
| Convection (300C/60 Min) | 24 | 100% | 3602 | 3611 | 38 |
| RTP (300C/60S) | 21 | 100% | 3619 | 3653 | 83 |
| RTP (300C/10S) | 22 | 100% | 3626 | 3639 | 57 |
| RTP (400C/1S) | 18 | 100% | 3658 | 3678 | 97 |

*Each Sample Comprises 31,356 Interconnects

FIG. 8

RAPID THERMAL PROCESSING FOR DIRECT BONDING

CROSS-REFERENCE TO RELATED APPLICATIONS

This application claims priority to U.S. Provisional Patent Application No. 63/374,881, filed Sep. 7, 2022, titled "RAPID THERMAL PROCESSING FOR DIRECT BONDING," the entire contents of each of which are hereby incorporated herein by reference.

BACKGROUND

Field

The field relates to bonded structures and methods of forming a direct hybrid bonded structure using rapid thermal processing.

Description of the Related Art

Microelectronic elements, such as integrated device dies or chips, may be mounted or stacked on other elements thereby forming a bonded structure. Hybrid bonding involves directly bonding non-conductive features (e.g., inorganic dielectrics) of different elements together, without intervening adhesives, while also directly bonding conductive features (e.g., metal pads or lines) of the elements together. For example, a microelectronic element can be mounted to a carrier, such as a package substrate, an interposer, a reconstituted wafer or element, etc. As another example, a microelectronic element can be stacked on top of another microelectronic element, e.g., a first integrated device die can be stacked on a second integrated device die. Each of the microelectronic elements can have conductive pads for mechanically and electrically bonding the elements to one another. There is a continuing need for improved methods for forming the bonded structure.

BRIEF DESCRIPTION OF THE DRAWINGS

Specific implementations will now be described with reference to the following drawings, which are provided by way of example, and not limitation.

FIG. 8 is a chart showing experimental results indicating reliability of bonded structures formed using various methods disclosed herein.

DETAILED DESCRIPTION OF THE PREFERRED EMBODIMENT

Various embodiments disclosed herein relate to directly bonded structures in which two or more elements can be directly bonded to one another without an intervening adhesive. Such processes and structures are referred to herein as "direct bonding" processes or "directly bonded" structures. Direct bonding can involve bonding of one material on one element and one material on the other element (also referred to as "uniform" direct bond herein), where the materials on the different elements need not be the same. Direct bonding can also involve bonding of multiple materials on one element to multiple materials on the other element (e.g., hybrid bonding).

Figure 1A:
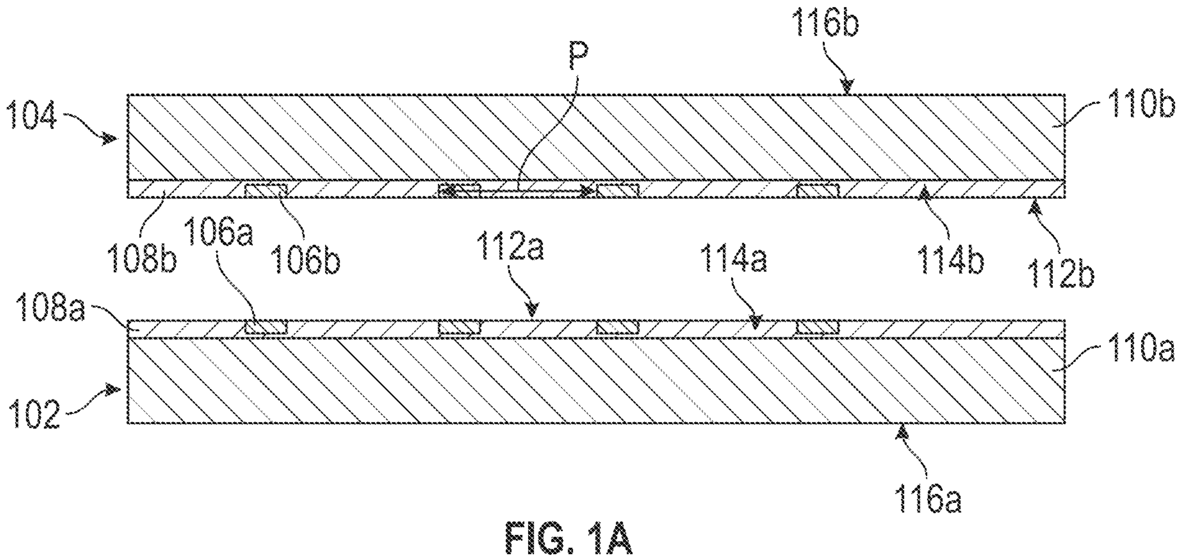
FIG. 1A is a schematic cross-sectional side view of two elements prior to direct hybrid bonding.
Figure 1B:
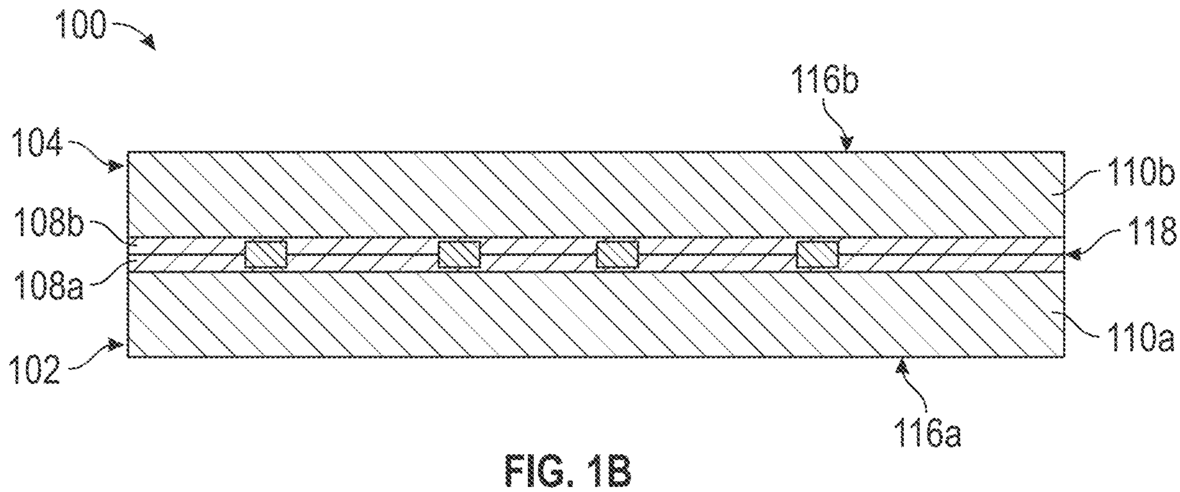
FIG. 1B is a schematic cross-sectional side view of the two elements shown in FIG. 1A after direct hybrid bonding.

FIGS. 1A and 1B schematically illustrate cross-sectional side views of two elements 102, 104 prior to and after, respectively, a process for forming a directly bonded structure, and more particularly a hybrid bonded structure 100 without an intervening adhesive according to some embodiments. Hybrid bonding is a species of direct bonding in which both nonconductive features directly bond to nonconductive features, and conductive features directly bond to conductive features. In FIGS. 1A and 1B, a bonded structure 100 comprises two elements 102 and 104 that can be directly bonded to one another at a bond interface 118 without an intervening adhesive. Two or more microelectronic elements 102 and 104 (such as semiconductor elements, including, for example, integrated device dies, wafers, passive devices, individual active devices such as power switches, etc.) may be stacked on or bonded to one another to form the bonded structure 100. Conductive features 106*a* (e.g., contact pads, traces, electrodes, exposed ends of vias or through substrate vias (TSVs)) of a first element 102 may be electrically connected to corresponding conductive features 106*b* of a second element 104. As explained below, in other implementations, the elements 102 and/or 104 may not include conductive features at the bond interface 118. Any suitable number of elements can be stacked in the bonded structure 100. For example, a third element (not shown) can be stacked on the second element 104, a fourth element (not shown) can be stacked on the third element, and so forth. In such implementations, TSVs can be formed to provide vertical electrical communication between and/or among the vertically-stacked elements. Additionally or alternatively, one or more additional elements (not shown) can be stacked laterally adjacent one another along the first element 102. In some embodiments, a laterally stacked additional element may be smaller than the second element. In some embodiments, the laterally stacked additional element may be two times smaller than the second element.

In some embodiments, the elements 102 and 104 are directly bonded to one another without an adhesive using a suitable direct bonding process. In various embodiments, a non-conductive field region that includes a non-conductive or dielectric material can serve as a first bonding layer 108*a* of the first element 102 which can be directly bonded to a corresponding non-conductive field region that includes a non-conductive or dielectric material serving as a second bonding layer 108*b* of the second element 104 without an adhesive. The non-conductive bonding layers 108*a* and 108*b* can be disposed on respective front sides 114*a* and 114*b* of base substrate portions 110*a* and 110*b*. In some embodiments, the base substrate portion can comprise a device portion, such as a bulk semiconductor (e.g., silicon) portion of the elements 102, 103, and back-end-of-line (BEOL) interconnect layers over such semiconductor portions. Active devices and/or circuitry can be patterned and/or otherwise disposed in or on the base substrate portions 110*a* and 110*b*. Active devices and/or circuitry can be disposed at or near the front sides 114*a* and 114*b* of the base substrate portions 110*a* and 110*b*, and/or at or near opposite backsides 116*a* and 116*b* of the base substrate portions 110*a* and 110*b*. In other embodiments, the base substrate portions 110*a*, 110*b* may not include active circuitry, but may instead comprise dummy substrates, passive interposers, passive optical elements (e.g., glass substrates, gratings, lenses), etc. Bonding layers can be provided on front sides and/or back sides of the elements. The non-conductive material can be referred to as a non-conductive bonding region or bonding layer 108*a* of the first element 102. In some embodiments, the non-conductive bonding layer 108*a* of the first element 102 can be directly bonded to the corresponding non-conductive bonding layer 108*b* of the second element 104 using dielectric-to-dielectric bonding techniques.

To effectuate direct bonding between the bonding layers 108*a*, 108*b*, the bonding layers 108*a*, 108*b* can be polished to a high degree of smoothness (e.g., by chemical-mechanical polishing, or CMP), activated with a suitable species, and bonded to one another at room temperature, without the need for application of a voltage, and without the need for application of external pressure or force beyond that used to initiate contact between the two elements 102, 104. The nonconductive bonding surfaces 112*a* and 112*b* can be polished using, for example, chemical mechanical polishing (CMP). The roughness of the polished bonding surfaces 112*a* and 112*b* can be less than 30 Å rms. For example, the roughness of the bonding surfaces 112*a* and 112*b* can be in a range of about 0.1 Å rms to 15 Å rms, 0.5 Å rms to 10 Å rms, or 1 Å rms to 5 Å rms.

The bonding surfaces 112*a* and 112*b* can be cleaned and exposed to a plasma and/or etchants to activate the surfaces 112*a* and 112*b*. In some embodiments, the surfaces 112*a* and 112*b* can be terminated with a species after activation or during activation (e.g., during the plasma and/or etch processes). Without being limited by theory, in some embodiments, the activation process can be performed to break chemical bonds at the bonding surfaces 112*a* and 112*b*, and the termination process can provide additional chemical species at the bonding surfaces 112*a* and 112*b* that alters the chemical bond and/or improves the bonding energy during direct bonding. In some embodiments, the activation and termination are provided in the same step, e.g., a plasma to activate and terminate the surfaces 112*a* and 112*b*. In other embodiments, the bonding surfaces 112*a* and 112*b* can be terminated in a separate treatment to provide the additional species for direct bonding. In various embodiments, the terminating species can comprise nitrogen. For example, in some embodiments, the bonding surface(s) 112*a*, 112*b* can be exposed to a nitrogen-containing plasma. Further, in some embodiments, the bonding surfaces 112*a* and 112*b* can be exposed to fluorine. For example, there may be one or multiple fluorine concentration peaks at or near a bond interface 118 between the first and second elements 102, 104. Typically, fluorine concentration peaks occur at interfaces between material layers.

Thus, in the directly bonded structure 100, the bond interface 118 between two non-conductive materials (e.g., the bonding layers 108*a* and 108*b*) can comprise a very smooth interface with higher nitrogen content and/or fluorine concentration peaks at the bond interface 118. Additional examples of activation and/or termination treatments may be found throughout U.S. Pat. Nos. 9,564,414; 9,391,143; and 10,434,749, the entire contents of each of which are incorporated by reference herein in their entirety and for all purposes. The roughness of the polished bonding surfaces 112*a* and 112*b* can be slightly rougher (e.g., about 1 Å rms to 30 Å rms, 3 Å rms to 20 Å rms, or possibly rougher) after an activation process. Accordingly, non-conductive or dielectric-to-dielectric bonds may be formed without an adhesive using the direct bonding techniques disclosed at least in U.S. Pat. Nos. 9,564,414; 9,391,143; and 10,434,749.

In various embodiments, the bonding layers 108*a* and/or 108*b* can comprise a non-conductive material such as a dielectric material, such as silicon oxide, or an undoped semiconductor material, such as undoped silicon. Suitable dielectric bonding surface or materials for direct bonding include but are not limited to inorganic dielectrics including silicon, such as silicon oxide, silicon nitride, or silicon oxynitride, or can include carbon, such as silicon carbide, silicon oxycarbonitride, low K dielectric materials, SiCOH dielectrics, silicon carbonitride or diamond-like carbon or a material comprising a diamond surface. Such carbon-containing ceramic materials can be considered inorganic, despite the inclusion of carbon. In some embodiments, the dielectric materials at the bonding surface do not comprise polymer materials, such as epoxy (e.g., epoxy adhesives, cured epoxies, or epoxy composites such as FR-4 materials), resin or molding materials.

In some embodiments, at least one of the elements to be bonded can comprise an organic or ceramic substrate (e.g., as the base substrate portion 110*a*, 110*b* of the element). In such embodiments, for example, an inorganic bonding layer can be deposited on a first element including the organic or ceramic substrate (e.g., a package substrate including one or more organic or ceramic materials). A second element can be directly bonded to the inorganic bonding layer without an adhesive. Additional details regarding direct bonding to organic or ceramic substrates may be found throughout (and including at least, e.g., ¶¶[0016]-[0026] and [0038]-[0039] of) U.S. patent application Ser. No. 18/145,607, filed Dec. 22, 2022, the entire contents of which are incorporated by reference herein in their entirety and for all purposes.

In other embodiments, the bonding layers 108*a* and/or 108*b* can comprise an electrically conductive material, such as a deposited conductive oxide material, e.g., indium tin oxide (ITO). Additional examples of directly bonded structures utilizing conductive oxide materials can be found throughout U.S. Provisional Patent Application No. 63/524,564, filed Jun. 30, 2023, the entire contents of which is incorporated by reference herein in its entirety and for all purposes.

Embodiments described herein are particularly useful for reducing thermal budget consumption for direct hybrid bonding. For example, in some embodiments, the base substrate portions 110*a* and 110*b* can have significantly different coefficients of thermal expansion (CTEs) defining a heterogenous structure. The CTE difference between the base substrate portions 110*a* and 110*b*, and particularly between bulk semiconductor, typically single crystal portions of the base substrate portions 110*a*, 110*b*, can be greater than 5 ppm or greater than 10 ppm. For example, the CTE difference between the base substrate portions 110*a* and 110*b* can be in a range of 5 ppm to 100 ppm, 5 ppm to 40 ppm, 10 ppm to 100 ppm, or 10 ppm to 40 ppm.

In some embodiments, one of the base substrate portions 110*a* and 110*b* can comprise optoelectronic single crystal materials, including perovskite materials, that are useful for optical piezoelectric or pyroelectric applications, and the other of the base substrate portions 110*a*, 110*b* comprises a more conventional substrate material. For example, one of the base substrate portions 110*a*, 110*b* comprises lithium tantalate (LiTaO3) or lithium niobate (LiNbO3), and the other one of the base substrate portions 110*a*, 110*b* comprises silicon (Si), quartz, fused silica glass, sapphire, or a glass. In other embodiments, one of the base substrate portions 110*a* and 110*b* comprises a III-V single semiconductor material, such as gallium arsenide (GaAs) or gallium nitride (GaN), and the other one of the base substrate portions 110*a* and 110*b* can comprise a non-III-V semiconductor material, such as silicon (Si), or can comprise other materials with similar CTE, such as quartz, fused silica glass, sapphire, or a glass. It can be challenging to form a reliable bonding between such heterogenous substrates, and the stress from the CTE difference calls for a lower thermal budget during the annealing process. Various rapid thermal processes disclosed herein can enable such lower thermal budgets for annealing for direct hybrid bonded. The skilled artisan will appreciate that lowering thermal budgets for annealing can be advantageous for a number of other types of direct bonding as well.

In some implementations (not illustrated), each bonding layer has one material. The materials of opposing bonding layers on the different elements can be the same or different, and may comprise elemental or compound materials. In such implementations, the bonding layers can be patterned, or can be unpatterned such that the bonding surface of each element includes a blanket deposited material. For example, in some embodiments, nonconductive bonding layers can be blanket deposited over the base substrate portions without being patterned with conductive features (e.g., without pads). In other embodiments, the bonding layers can be patterned on one or both elements, and can be the same or different from one another, but one material from each element is directly bonded without adhesive across the surface(s) of the elements (or across the surface of the smaller element if the elements are differently-sized). For such directly bonded nonconductive bonding layers, it may be that only nonconductive materials are bonded to one another (e.g., there are no conductive direct bonds between the elements). Such direct bonding processes may be referred to as “uniform” direct bond to signify that only one material on each element is directly bonded. Example uniform direct bonding processes include the ZIBOND® techniques commercially available from Adeia of San Jose, CA. In such uniform direct bonding processes, one or both of the nonconductive bonding layers may be without any conductive features patterned therein. Alternatively, one or both of the nonconductive bonding layers may include one or more conductive features, but the conductive features are not involved in the bonding. An alternative example of uniform direct bonding processes can include electrically conductive material(s), such as deposited conductive oxides, as disclosed in U.S. Provisional Patent Application No. 63/524,564, filed Jun. 30, 2023, the entire contents of which are incorporated by reference in their entirety and for all purposes.

In various embodiments, hybrid bonds can be formed without an intervening adhesive. Most commonly, hybrid bonds involve opposing nonconductive surfaces that are directly bonded without an intervening adhesive and opposing conductive features that are directly bonded without an intervening adhesive. For example, as explained above, nonconductive bonding surfaces 112*a* and 112*b* can be prepared for direct bonding, such as by polishing to a high degree of smoothness, activating and/or terminating with a suitable species, and bringing into contact with one another (for example, at room temperature and without application of pressure beyond that used to bring the elements 102, 104 into contact). In hybrid bonding, conductive features 106*a* of the first element 102 can also be directly bonded to corresponding conductive features 106*b* of the second element 104 without an adhesive (e.g., without solder or other conductive adhesive intervening between the conductive features 106*a*, 106*b*). For example, a direct hybrid bonding technique can be used to provide conductor-to-conductor direct bonds along the bond interface 118 that includes covalently direct bonded non-conductive-to-non-conductive (e.g., dielectric-to-dielectric) surfaces, prepared as described above. In various embodiments, the conductor-to-conductor (e.g., conductive feature 106*a* to conductive feature 106*b*) direct bonds and the dielectric-to-dielectric direct bonds can be formed using the hybrid bonding techniques disclosed at least in U.S. Pat. No. 9,716,033, the entire contents of which are incorporated by reference herein in their entirety and for all purposes. In hybrid bonding embodiments described herein, conductive features are provided within non-conductive bonding layers, and both conductive and nonconductive features are prepared for direct bonding, such as by the planarization, activation and/or termination treatments described above. Thus, the bonding surface prepared for hybrid bonding includes both conductive and non-conductive features.

For example, non-conductive (e.g., dielectric) bonding surfaces 112*a*, 112*b* (for example, inorganic dielectric surfaces) can be prepared and directly bonded to one another without an intervening adhesive as explained above. Conductive contact features (e.g., conductive features 106*a* and 106*b* which may be at least partially surrounded by non-conductive dielectric field regions within the bonding layers 108*a*, 108*b*) may also directly bond to one another without an intervening adhesive. In various embodiments, the conductive features 106*a*, 106*b* can comprise discrete pads or traces at least partially embedded in the non-conductive field regions. In some embodiments, the conductive contact features can comprise exposed contact surfaces of through substrate vias (e.g., through silicon vias (TSVs)).

In some embodiments, prior to direct bonding portions of the respective conductive features 106*a* and 106*b* can be recessed below exterior (e.g., upper) surfaces (non-conductive bonding surfaces 112*a* and 112*b*) of the dielectric field region or non-conductive bonding layers 108*a* and 108*b*, for example, recessed by less than 30 nm, less than 20 nm, less than 15 nm, or less than 10 nm, for example, recessed in a range of 2 nm to 20 nm, or in a range of 4 nm to 10 nm. The recess can be at or near the middle or center of the cavity in which the conductive features 106*a*, 106*b* are disposed, and, additionally or alternatively, can extend or be disposed along sides of the cavity in which the conductive features 106*a*, 106*b* are disposed. In various embodiments, prior to direct bonding, the recesses in the opposing elements can be sized such that the total gap between opposing contact pads is less than 15 nm, or less than 10 nm.

The non-conductive bonding layers 108*a* and 108*b* can be directly bonded to one another without an adhesive at room temperature in some embodiments and, subsequently, the bonded structure 100 can be annealed. Upon annealing, the conductive features 106*a* and 106*b* can expand and contact one another to form a metal-to-metal direct bond. Beneficially, the use of Direct Bond Interconnect, or DBI®, techniques commercially available from Adeia of San Jose, CA, can enable high density of conductive features 106*a* and 106*b* to be connected across the direct bond interface 118 (e.g., small or fine pitches for regular arrays).

In some embodiments, a pitch p of the conductive features 106*a* and 106*b*, such as conductive traces embedded in the bonding surface of one of the bonded elements, may be less than 100 μm, less than 10 μm, less than 2 μm, or even less than 1 μm. For some applications, the ratio of the pitch of the conductive features 106*a* and 106*b* to one of the dimensions (e.g., a diameter) of the bonding pad is less than is less than 20, or less than 10, or less than 5, or less than 3 and sometimes desirably less than 2. In other applications, the width of the conductive traces embedded in the bonding surface of one of the bonded elements may range between 0.3 μm to 50 μm, e.g., in a range of 0.3 μm to 20 μm, 0.3 μm to 3 μm, 0.5 μm to 50 μm, 0.75 μm to 25 μm, or 1 μm to 5 μm. In various embodiments, the conductive features 106*a* and 106*b* and/or traces can comprise copper or copper alloys, although other metals may be suitable. For example, the conductive features disclosed herein, such as the conductive features 106*a* and 106*b*, can comprise fine-grain metal (e.g., a fine-grain copper). Further, a major lateral dimension (e.g., a pad diameter) can be small as well, e.g., in a range of about 0.25 μm to 30 μm, in a range of about 0.25 μm to 5 μm, or in a range of about 0.5 μm to 5 μm.

Thus, in direct bonding processes, a first element 102 can be directly bonded to a second element 104 without an intervening adhesive. In some arrangements, the first element 102 can comprise a singulated element, such as a singulated integrated device die. In other arrangements, the first element 102 can comprise a carrier or substrate (e.g., a wafer) that includes a plurality (e.g., tens, hundreds, or more) of device regions that, when singulated, form a plurality of integrated device dies. Similarly, the second element 104 can comprise a singulated element, such as a singulated integrated device die. In other arrangements, the second element 104 can comprise a carrier or substrate (e.g., a wafer). The embodiments disclosed herein can accordingly apply to wafer-to-wafer (W2 W), die-to-die (D2D), or die-to-wafer (D2 W) bonding processes. In W2 W processes, two or more wafers can be directly bonded to one another (e.g., direct hybrid bonded) and singulated using a suitable singulation process. After singulation, side edges of the singulated structure (e.g., the side edges of the two bonded elements) can be substantially flush (substantially aligned x-y dimensions) and/or the edges of the bonding interfaces for both bonded and singulated elements can be coextensive, and may include markings indicative of the common singulation process for the bonded structure (e.g., saw markings if a saw singulation process is used).

As explained herein, the first and second elements 102 and 104 can be directly bonded to one another without an adhesive, which is different from a deposition process and results in a structurally different interface compared to a deposition. In one application, a width of the first element 102 in the bonded structure is similar to a width of the second element 104. In some other embodiments, a width of the first element 102 in the bonded structure 100 is different from a width of the second element 104. Similarly, the width or area of the larger element in the bonded structure may be at least 10% larger than the width or area of the smaller element. The first and second elements 102 and 104 can accordingly comprise non-deposited elements. Further, directly bonded structures 100, unlike deposited layers, can include a defect region along the bond interface 118 in which nanometer-scale voids (nanovoids) are present. The nanovoids may be formed due to activation of the bonding surfaces 112*a* and 112*b* (e.g., exposure to a plasma).

As explained above, the bond interface 118 can include concentration of materials from the activation and/or last chemical treatment processes. For example, in embodiments that utilize a nitrogen plasma for activation, a nitrogen concentration peak can be formed at the bond interface 118. The nitrogen concentration peak can be detectable using secondary ion mass spectroscopy (SIMS) techniques. In various embodiments, for example, a nitrogen termination treatment (e.g., exposing the bonding surface to a nitrogen-containing plasma) can replace OH groups of a hydrolyzed (OH-terminated) surface with NH2 molecules, yielding a nitrogen-terminated surface. In embodiments that utilize an oxygen plasma for activation, an oxygen concentration peak can be formed at the bond interface 118. In some embodiments, the bond interface 118 can comprise silicon oxynitride, silicon oxycarbonitride, or silicon carbonitride. As explained herein, the direct bond can comprise a covalent bond, which is stronger than van Der Waals bonds. The bonding layers 108*a* and 108*b* can also comprise polished surfaces that are planarized to a high degree of smoothness.

For hybrid bonded elements 102, 104, as shown, the orientations of one or more conductive features 106*a*, 106*b* from opposite elements can be opposite to one another. As is known in the art, conductive features in general can be formed with close to vertical sidewalls, particularly where directional reactive ion etching (RIE) defines the conductor sidewalls either directly though etching the conductive material or indirectly through etching surrounding insulators in damascene processes. However, some slight taper to the conductive features' sidewalls can be present, wherein the conductor becomes narrower farther away from the surface initially exposed to the etch. The taper can be even more pronounced when the conductive sidewall is defined directly or indirectly with isotropic wet or dry etching. In the illustrated embodiment, at least one conductive feature **106*b* in the bonding layer 108*b* (and/or at least one internal conductive feature, such as a BEOL feature) of the upper element 104 may be tapered or narrowed upwardly, away from the bonding surface 112*b*. By way of contrast, at least one conductive feature 106*a* in the bonding layer 108*a* (and/or at least one internal conductive feature, such as a BEOL feature) of the lower element 102 may be tapered or narrowed downwardly, away from the bonding surface 112*a*. Similarly, any bonding layers (not shown) on the backsides 116*a*, 116*b* of the elements 102, 104 may taper or narrow away from the backsides, with an opposite taper orientation relative to front side conductive features 106*a*, 106*b*** of the same element.

As described above, the non-conductive bonding layers **108*a*, 108*b* can be directly bonded to one another without an adhesive and, subsequently, the bonded structure 100 can be annealed. Upon annealing, the conductive features 106*a*, 106*b* can expand and contact one another to form a metal-to-metal direct bond. In some embodiments, the materials of the conductive features 106*a*, 106*b* can interdiffuse during the annealing process. In various embodiments, the metal-to-metal bonds between the conductive features 106*a* and 106*b* can be joined such that metal grains grow into each other across the bond interface 118. In some embodiments, the metal is or includes copper, which can have grains oriented along the 111 crystal plane for improved copper diffusion across the bond interface 118. In some embodiments, the conductive features 106*a* and 106*b* may include nanotwinned copper grain structure, which can aid in merging the conductive features during anneal. The bond interface 118 can extend substantially entirely to at least a portion of the bonded conductive features 106*a* and 106*b*, such that there is substantially no gap between the non-conductive bonding layers 108*a* and 108*b* at or near the bonded conductive features 106*a* and 106*b*. In some embodiments, a barrier layer may be provided under and/or laterally surrounding the conductive features 106*a* and 106*b* (e.g., which may include copper). In other embodiments, however, there may be no barrier layer under the conductive features 106*a* and 106*b***, for example, as described in U.S. Pat. No. 11,195,748, which is incorporated by reference herein in its entirety and for all purposes.

As described herein, in direct bonding processes, such as uniform direct bonding and hybrid bonding, two elements are bonded together without an intervening adhesive. In non-direct bonding processes that utilize an adhesive, an intervening material is typically applied to one or both elements to effectuate a physical connection between the elements. For example, in some nonconductive adhesive-based processes, a flowable adhesive (e.g., an organic adhesive, such as an epoxy) can be applied to one or both elements and cured to form the physical connection between elements. In such nonconductive adhesive processes, the adhesive does not form a strong chemical bond with either element. In other processes, a conductive adhesive (e.g., solder) can be provided between the two elements, heated to melt the conductive adhesive, and cooled to form the connection between the two elements. In both nonconductive and conductive adhesive processes, the resulting attachment of the two adhered elements results from an intervening material that sticks or adheres to the two opposing elements to be joined. The connection is primarily a physical connection between the two elements, and does not involve the formation of covalent bonds or grain growth across the elements.

By contrast, direct bonding processes join two elements by forming strong chemical bonds (e.g., covalent bonds) between opposing nonconductive materials and/or by causing grain growth across the bonding interface between opposing conductive materials. For example, in direct bonding processes between nonconductive materials, one or both nonconductive surfaces of the two elements are planarized and chemically prepared (e.g., activated and/or terminated) such that when the elements are brought into contact, strong chemical bonds (e.g., covalent bonds) are formed, which are stronger than Van der Waals or hydrogen bonds. In some implementations (e.g., between opposing dielectric surfaces, such as opposing silicon oxide surfaces), the chemical bonds can occur spontaneously at room temperature upon being brought into contact. In some implementations, the chemical bonds can be strengthened after annealing the elements (e.g., for opposing conductive oxide structures, such as opposing ITO layers).

In hybrid bonding processes the interface includes conductive direct bonds and the conductive material (e.g., metallic material) typically expands upon annealing, but the direct bonds between surrounding nonconductive materials resist separation of the elements, such that the thermal expansion increases the internal contact pressure between the opposing conductive features. Annealing can also cause metallic grain growth across the bonding interface, such that grains from one element migrate across the bonding interface at least partially into the other element, and vice versa. Thus, in direct bonding processes that include conductive direct bonds, opposing conductive materials are joined without melting the conductive materials, such that bonds can form with much lower anneal temperatures compared to adhesive-based processes, such as soldering, where the conductive materials are heated above the melting temperature.

Various embodiments disclosed herein relate to using a rapid thermal process (RTP) to anneal the bonded structure 100. The RTP uses radiant energy sources to heat the bonded structure 100. The RTP can enable the bonded structure 100 to be heated to a target temperature, such as a temperature in a range of 250° C. to 500° C., very quickly compared to conventional convection oven annealing (e.g., less than 10 seconds, 7 seconds, 5 seconds, or 3 seconds). The RTP can more quickly heat the bonded structure 100 than other types of heating process, such as convection heating and conductive heating processes. Although RTP has been employed for annealing in a number of other contexts, it has been challenging to obtain temperature uniformity across substrates due to the nature of rapid radiant heating.

Figure 2A:
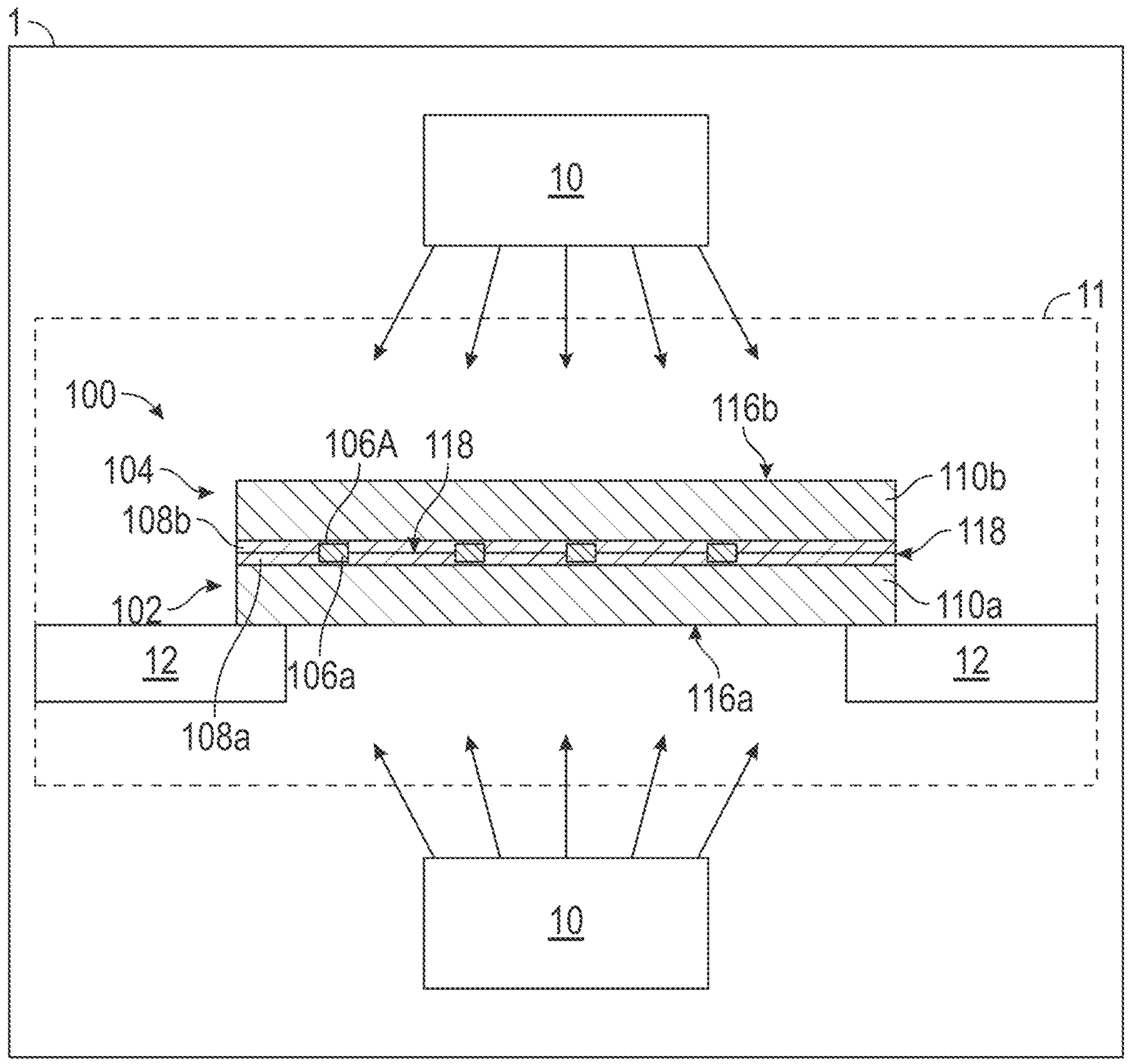
FIG. 2A is a schematic cross-sectional view of a bonded structure, after initial direct bonding of non-conductive regions together, in a rapid thermal processing (RTP) chamber.

FIG. 2A is a schematic cross section of a bonded structure 100 within an RTP system 1. In the illustrated example, the RTP system 1 includes a single-substrate RTP chamber 11. As shown, the bonded structure 100 is supported by a support structure 12 (e.g., susceptor, support fingers or brackets, or a support ring) in the chamber 11 in a manner that allows exposure to radiant heat (illustrated by arrows) from radiant energy sources 10, such as heat lamps. Typically the radiant energy sources 10 are positioned outside the chamber 11 and the chamber walls are transparent to wavelengths of light that accomplish the heating of the bonded structure 100. Similarly, the support structure 12 can be transparent to wavelengths of light that accomplish the heating of the bonded structure 100. The radiant energy sources 10 can be provided on one side of the bonded structure 100, two opposite sides of the bonded structure 100 as shown, or on multiple additional sides of the bonded structure 100. Radiant heat energy can be provided directly to the bonded structure 100 as shown, or by way of a radiant heat absorbent susceptor that extends under the bonded structure 100. Lamps or laser sources can be used as the radiant energy sources 10. The lamps can include, for example, gas-fillet tungsten filament lamps (e.g., infrared halogen lamps). For example, the lamps can emit radiation that has a wavelength in a visible to microwave range or a visible to infrared range. The RTP system 1 typically includes temperature sensors to estimate the substrate (bonded structure 100) temperature and provide feedback to temperature control systems that instruct the heating process.

Figure 2B:
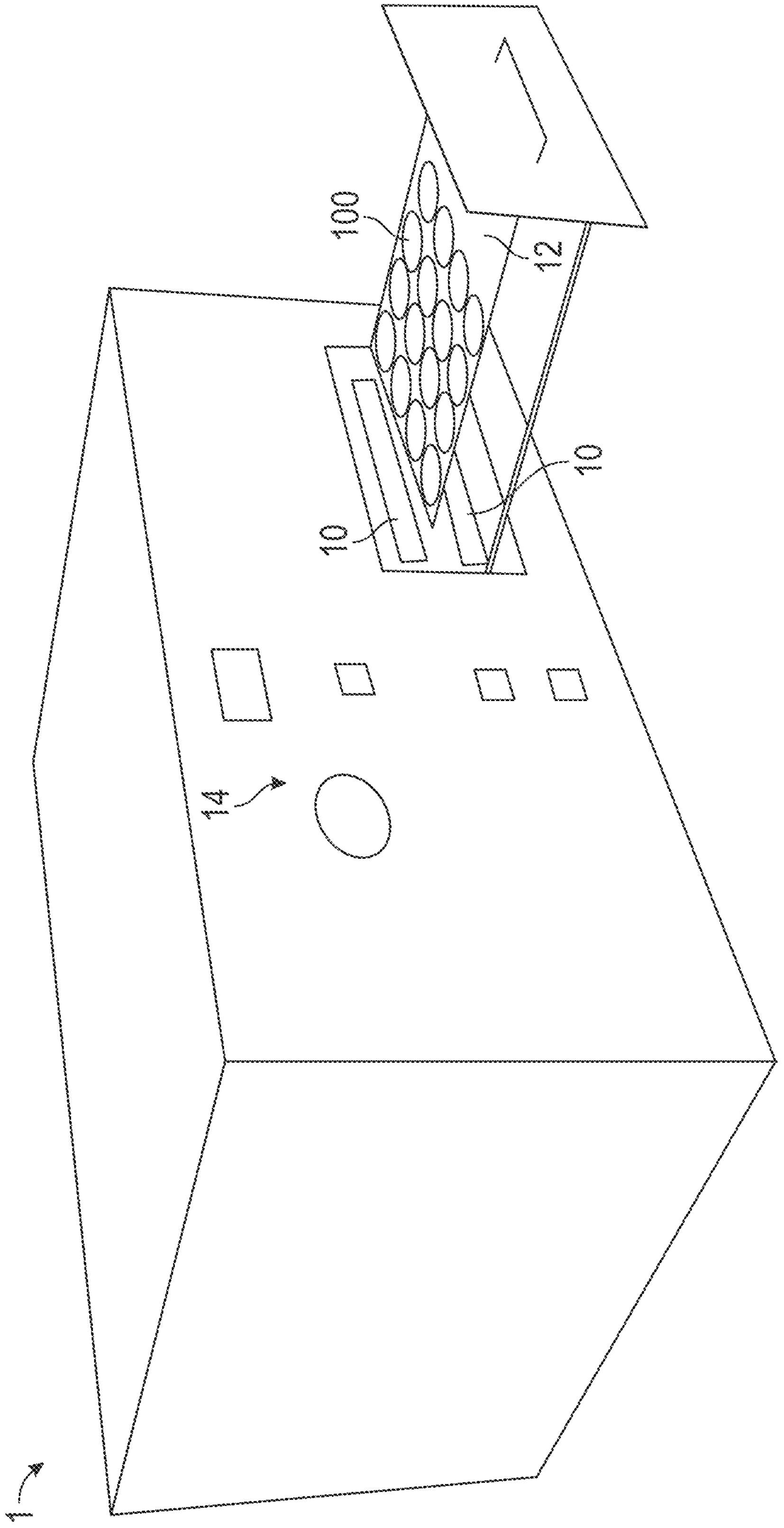
FIG. 2B is a schematic perspective view of an RTP system that can be used to anneal the bonded structure after initial bonding of non-conductive regions together.

FIG. 2B is a schematic perspective view of another example RTP system 1 that can be used to anneal multiple bonded structures 100 simultaneously. The RTP system 1 can include one or more radiant energy sources 10, a support structure 12 (e.g., tray or plate as part of or placeable on a drawer) for placing the bonded structure(s) 100, and a user interface 14 that includes switches for controlling the RTP system 1 and indicators for indicating the state of the RTP system 1. The radiant heat sources 10 can be lamps or laser sources as described above. In the illustrated embodiment, multiple bonded structure(s) 100 can be inserted into the RTP system 1 and heated by the radiation from the radiant energy sources 10. AccuThermo AW 810 RTP manufactured by Allwin 21 Corp. is an example of the RTP system 1.

Figure 2C:
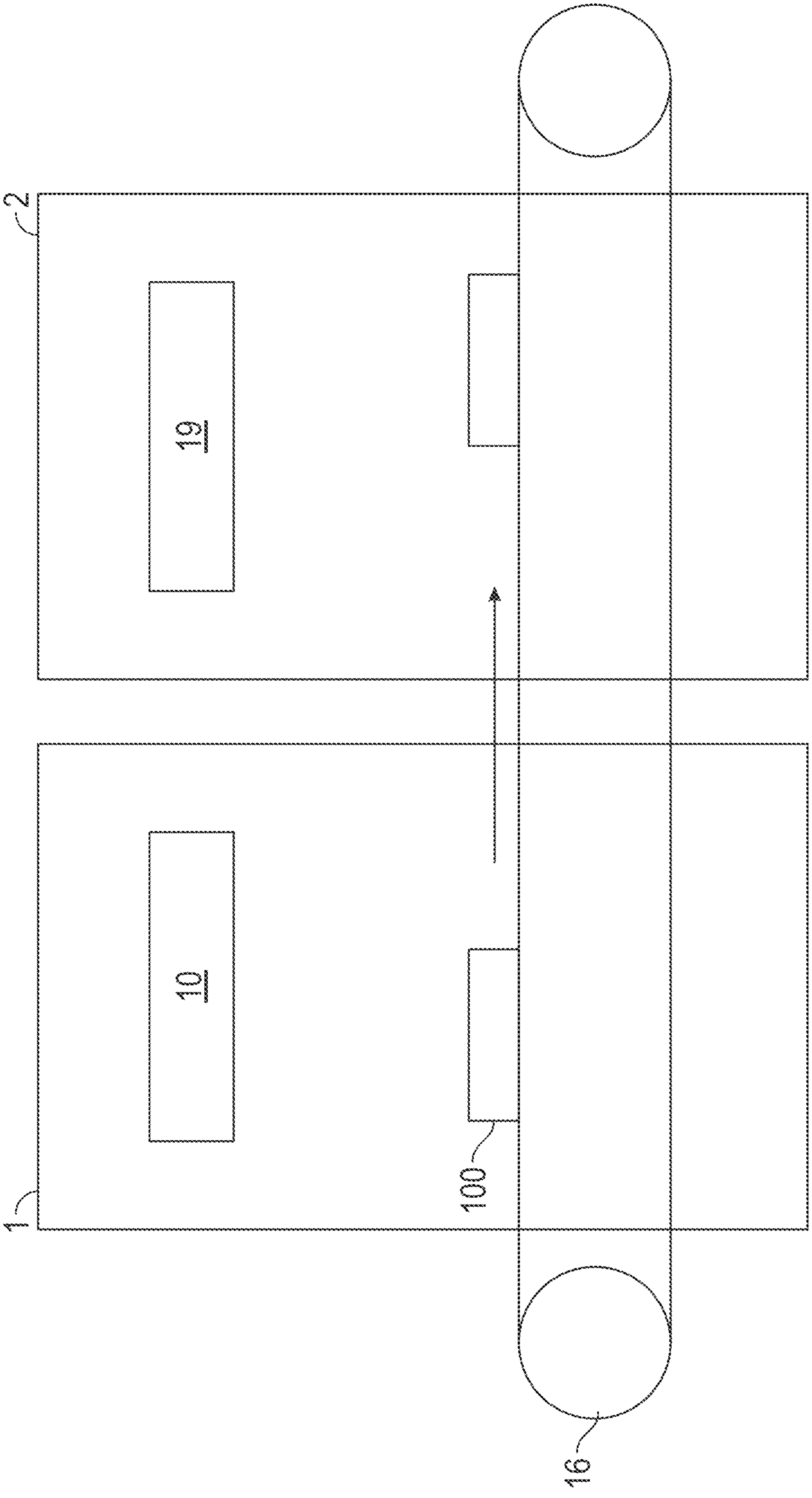
FIG. 2C is a schematic view of a heating system that moves bonded structures through heating zones.

FIG. 2C is a schematic view of a heating system. The heating system of FIG. 2C can comprise a belt furnace that includes a conveyor 16 (e.g., a belt conveyor) that carries substrate through the RTP heating system 1. The RTP heating system 1 can include the radiant energy source 10. The conveyor 16 can feed the bonded structure 100 through the RTP system 1.

Various embodiments disclosed herein can utilize two or more heating mechanisms for heating a bonded structure. For example, the bonded structure can be heated by way of the RTP and a non-RTP heating process such as a convection or conduction heating that does not use radiant energy for heating the bonded structure. In some embodiments, the bonded structure can be heated by way of the RTP, and separately heated by the non-RTP heating process in a separate anneal tool.

In some embodiments, an anneal system can include both an RTP zone (such as the illustrated RTP system 1), as well as a non-RTP heating system 2 having a second heating source 19, as shown in FIG. 2C. For example, an anneal process can include both RTP anneal and non-RTP anneal (e.g., convection heating), as will be understood from the process descriptions below. As shown in FIG. 2C, both anneal phases can be conducted in one tool, such as a conveyor belt tool having different types of heating in different zones, such as a radiative heating zone defined by the RTP heating system 1, and a convectively or conductively heated zone defined by the non-RTP system 2. This may allow the bonded structure to be heated by the RTP and the non-RTP heating process in a continuous process. Accordingly, a system can include both the RTP heating system 1 and the non-RTP heading system 2. In FIG. 2C, the annealing apparatus can include a system for conveyance of the bonded structure 100 between the RTP heading system 1 and the non-RTP heating system. The conveyance of FIG. 2C comprises the conveyor 16 that allows for a continuous process for multiple anneal phases through different heating zones.

Figure 2E:
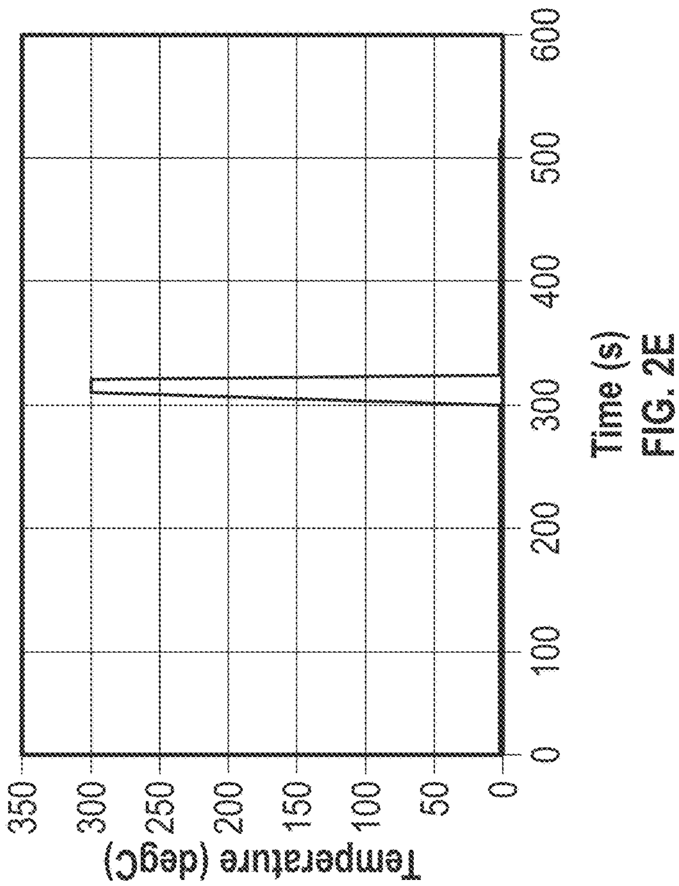
FIG. 2E is a graph showing an annealing profile of an anneal process using the RTP.
Figure 2D:
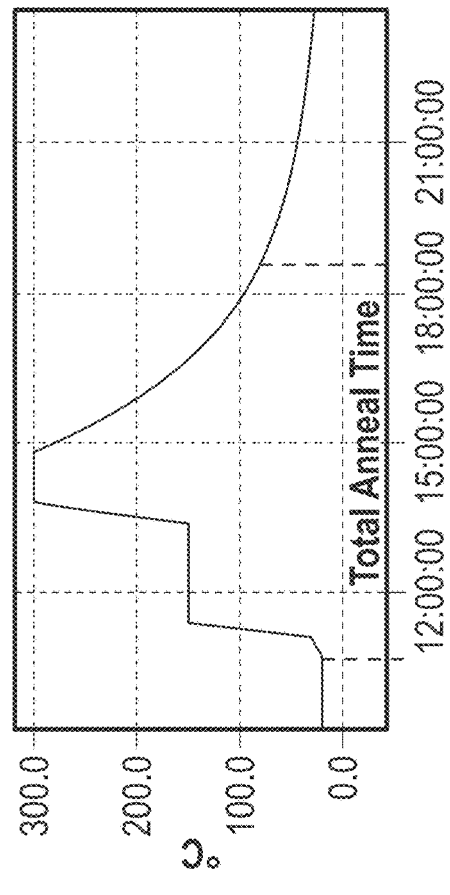
FIG. 2D is a graph showing an annealing profile of a typical convection anneal process with different stages.

FIG. 2D is a graph showing an annealing profile of a typical convection anneal process with different stages. FIG. 2E is a graph showing an annealing profile of an anneal process using the RTP. The convection anneal process can include a first, low temperature anneal at about 150° C. for about two hours followed by a second, high temperature anneal at about 300° C. for about an hour. The total anneal time of the convection anneal process illustrated in FIG. 2D is about 7.5 hours. The RTP anneal process can include an anneal at the peak temperature of about 300° C. for about 10 seconds. The RTP anneal process has a ramp rate of about 25° C. per second.

Figure 3A:
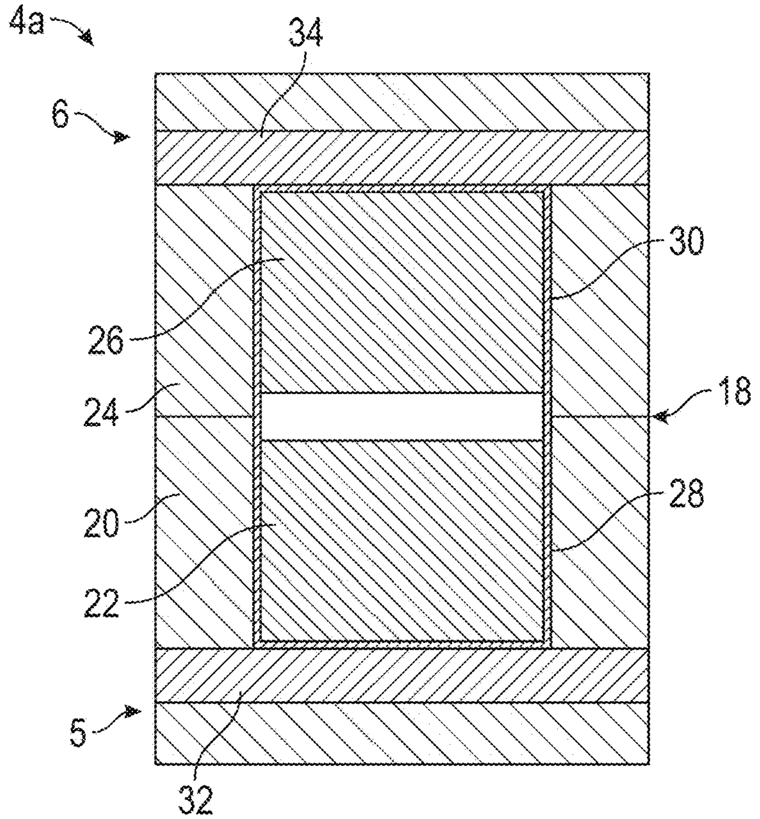
FIG. 3A is a schematic cross-sectional side view of a bonded structure prior to annealing.
Figure 3B:
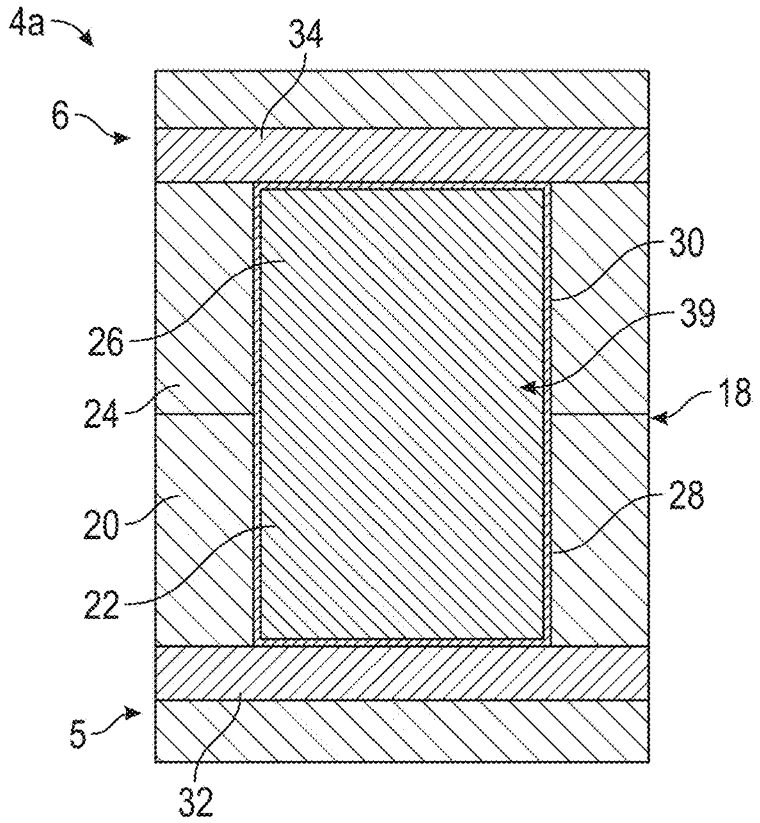
FIG. 3B is a schematic cross-sectional side view of the bonded structure after annealing, including RTP, to merge conductive features.

FIGS. 3A-3B show a process of annealing a bonded structure 4*a* according to an embodiment. The illustrated bonded structure 4*a*-4*d* can be a portion of a larger structure. For example, the larger structure can include substrate portions (e.g., the device portions 110*a*, 110*b*, including bulk single crystal portions, described above with respect to FIGS. 1A and 1B). Unless otherwise noted, components of FIGS. 3A-3B can be the same as or generally similar to like components shown in FIGS. 1A and 1B.

FIG. 3A is a schematic cross-sectional side view of the bonded structure 4*a* prior to annealing. The bonded structure 4*a* can include a first element 5 that includes a first non-conductive field region 20 and a first conductive feature 22, and a second element 6 that includes a second non-conductive field region 24 and a second conductive feature 26. In some embodiments, the first element 5 can include a first barrier layer 28 at least partially between the first non-conductive field region 20 and the first conductive feature 22, and the second element 6 can include a second barrier layer 30 at least partially between the second non-conductive field region 24 and the second conductive feature 26. The barriers (the first barrier 28 and the second barrier 30) can be formed of various materials (such as metal nitrides, carbides, silicides, etc.) and are useful in preventing or inhibiting metal (such as copper) of the conductive features from diffusing into the surrounding non-conductive materials. In some embodiments, the first and second elements 5, 6 can also include back end of line layers 32, 34, shown schematically to represent multiple metallization layers between the bonding layer (including non-conductive field regions 20, 24 and conductive features 22, 26 on each element 5, 6) and devices, which can be formed on or in bulk semiconductor materials. The bulk semiconductor materials can correspond to the substrate or device portions (e.g., the device portions 110*a*, 110*b* described above with respect to FIGS. 1A and 1B) which can define a majority of the elements 5, 6.

The first non-conductive field region 20 of the first element 5 is directly bonded to the second non-conductive field region 24 without an intervening adhesive along a bond interface 18. Surfaces of the first non-conductive field region 20 and the second non-conductive field region 24 can be prepared for direct bonding prior to contacting the first and second elements 5, 6, as described herein. For example, one or both of the surfaces of the first and second elements 5, 6 can be polished to have a surface roughness of less than 15 Å rms, less than 10 Å rms, or less than 5 Å rms. For example, the one or both of the surfaces of the first and second elements 5, 6 can have a surface roughness in a range of 1 Å rms to 15 Å rms, 1 Å rms to 10 Å rms, or 1 Å rms to 5 Å rms. As noted above, the direct bond between non-conductive materials of the two elements can be formed at room temperature, and can include formation of covalent bonds.

The conductive features 22, 26 can be recessed below respective bonding surfaces of the non-conductive field region 20, 24. For example, the conductive features 22, 26 can be recessed by less than 30 nm, less than 20 nm, less than 15 nm, or less than 10 nm, for example, recessed in a range of 2 nm to 20 nm, or in a range of 4 nm to 10 nm, relative to the respective bonding surfaces of the non-conductive field region 20, 24. In some embodiments, the recesses in the opposing elements 5, 6 can be sized such that the total gap between opposing conductive features 22, 26 is less than 15 nm, or less than 10 nm after the room temperature bonding of non-conductive materials and prior to annealing.

The first and second conductive features 22, 26 can comprise any suitable conductive material. In some embodiments, the first and second conductive features 22, 26 can comprise metal, such as copper. For example, the first and second conductive features 22, 26 can comprise a fine grain metal (e.g., fine grain copper). The fine grain metal can be defined as a metal having an average grain width less than 20 nm, less than 50 nm, less than 100 nm, less than 300 nm, or less than 500 nm. For example, the maximum width of grain in the fine grain metal can be in a range of 10 nm to 500 nm, 20 nm to 500 nm, or 100 nm to 300 nm. Various benefits of using the RTP disclosed herein may be pronounced when a fine grain metal is used as the first and/or second conductive features 22, 26 as compared to using larger grain metals. Additional details of fine grain metals may be found throughout U.S. patent application Ser. Nos. 17/684,841, 18/066,159, and 18/305,149, the entire contents of each of which are incorporated by reference herein in their entirety and for all purposes.

FIG. 3B illustrates the bonded structure 4*a* of FIG. 3A after annealing, including rapid thermal processing, to expand and merge conductive features 22, 26 of opposite elements 5, 6 and form a directly bonded conductive feature 39. Surprisingly, rapid thermal processing was found to reliably form electrical connections between aligned and recessed conductive features even for multiple such features distributed over large substrates. Die to wafer (D2 W) bonding experiments were conducted with a die size of 128 $mm^2$ (8 mm×16 mm). Between a die and the wafer, there are 31,356 daisy chain links, such that current can only flow if all the die contacts are electrically connected across the bond interface, each contact being about 10 μm in diameter with a pitch of about 40 μm. The experiments were conducted under nitrogen ambient to prevent or mitigate oxidation of the exposed pads for probing the interconnect array. All of the contacts were found to have electrical connection after room temperature bonding and annealing in an RTP system.

The RTP can quickly increase the temperature of the bonded structure 4*a* such that the first and second conductive features 22, 26 expand to make contact with one another. For example, the RTP can bring the temperature of the bonded structure 4*a* to a target temperature, such as a temperature in a range of 250° C. to 500° C., in, for example, less than 10 seconds, 7 seconds, 5 seconds, or 3 seconds. In some embodiments, due to the material characteristics of the non-conductive portion (the first and second non-conductive field region 20, 24) and the conductive portion (the first and second conductive features 22, 26), the radiation used in the RTP can raise the temperature of the conductive portion more quickly than the non-conductive portion. For example, silicon and dielectric materials conventionally used to form microelectronic elements, such as integrated circuits, tend to be more transparent to wavelengths used in RTP tools as compared to conductive materials like metals. This can cause problems in some contexts, since the temperature of the overall substrate or element can be measured but may not reflect the actual temperature of more absorbent conductive materials. Nevertheless, the non-uniform absorption of radiant heat can be beneficial for annealing in the direct hybrid bonding context. Because the temperature of the conductive portion can be raised more quickly than the non-conductive portion, the conductive portion can be heated to a higher temperature than the non-conductive portion at a given time. Conventional hybrid bonding anneals rely on differences in coefficients of thermal expansion (CTE) between the conductive materials and their surrounding non-conductive materials to achieve differential expansion of the conductive materials into contact. However, in the present disclosure, radiant heat aids thermal expansion of the conductive materials by providing differential temperatures in addition to differential CTE. Both temperature differentials and CTE differentials contribute to differential expansion of the conductive materials relative to the surrounding non-conductive materials, which can enable a reliable bond between the first and second conductive features 22, 26 at lower temperatures and/or lower anneal times compared to conventional annealing.

Figure 4A:
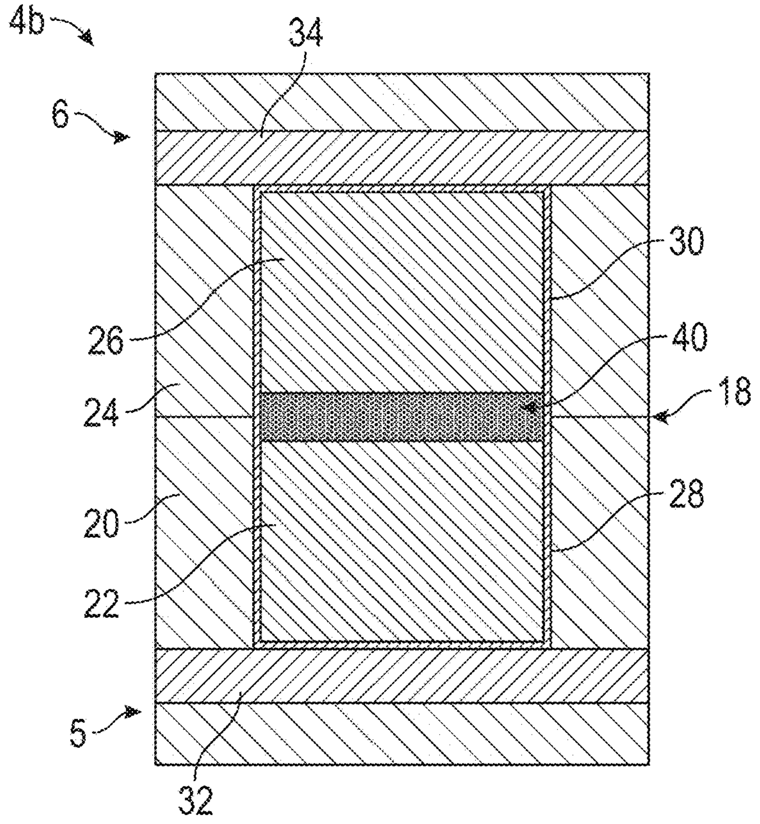
FIG. 4A is a schematic cross-sectional side view of the bonded structure similar to that of FIG. 3A after a first annealing process.

The anneal may include multiple phases, of which one or more phases are rapid thermal anneals. For example, FIG. 4A is a schematic cross-sectional side view of the bonded structure 4*b* after a first annealing process. The first annealing process can include a rapid thermal process (RTP). The bonded structure 4*a* shown in FIG. 3A can be annealed to form the bonded structure 4*b*. In the bonded structure 4*b*, the first and second conductive features 22, 26 are directly bonded and electrically connected to one another. In some embodiments, the first annealing process can form an initial contact between the first and second conductive features 22, 26.

As a result of the first annealing process, the bonded structure 4*b* can include a rapid growth structure 40 characteristic of an RTP anneal. In some embodiments, the rapid growth structure 40 can be different from a result of a non-RTP heating process. For example, the rapid growth structure 40 can comprise grain configurations traversing the bond interface 18 (see FIG. 6A-6D) that are different from the grain configurations in a bonded structure that has been annealed using only the non-RTP heating process.

In the bonded structure 4*b*, interdiffusion between the bonded first and second conductive features 22, 26 may take place. However, in some embodiments, a majority of the interdiffusion between the bonded first and second conductive features 22, 26 can take place in a second annealing process (see FIG. 4B). As described above with respect to FIG. 3B, if RTP alone is used for annealing the bonded structure, the RTP may be prolonged and/or at a higher peak temperature to accomplish sufficient interdiffusion for the final product. The RTP can initiate contact across the gap at an early stage, typically multiple connections per a conductive feature pair, and those connections can serve to accelerate interdiffusion in a subsequent non-RTP anneal, which can significantly reduce overall annealing time.

Figure 4B:
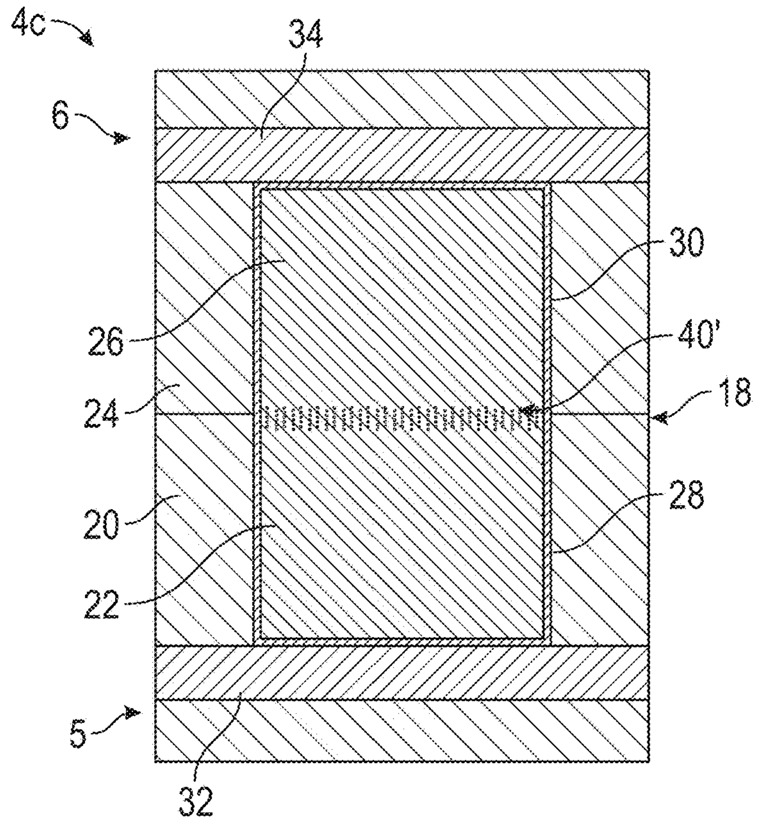
FIG. 4B is a schematic cross-sectional side view of the bonded structure of FIG. 4A after a second annealing process.
Figure 4C:
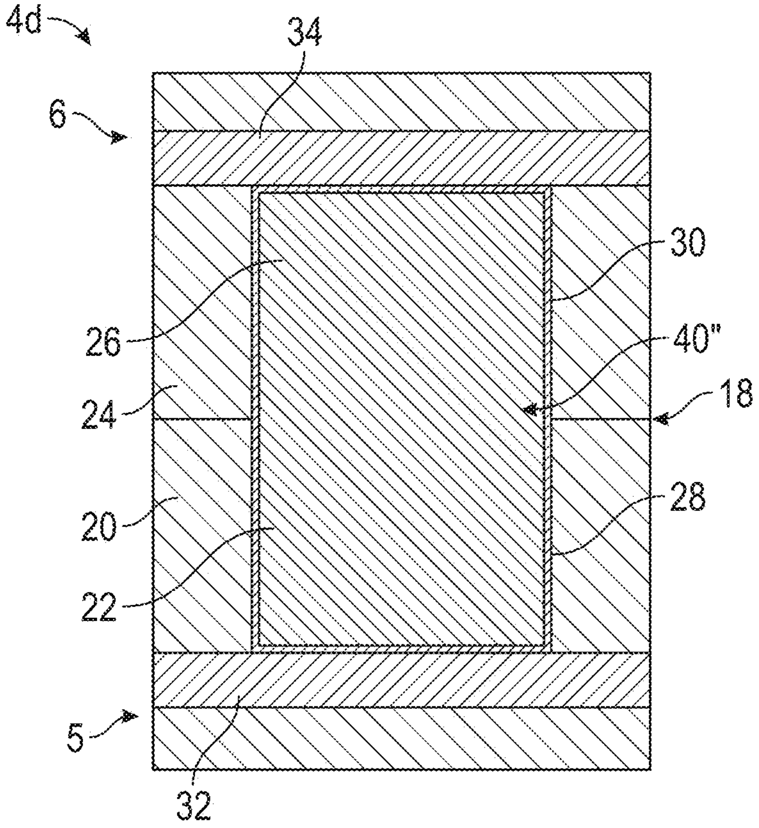
FIG. 4C is a schematic cross-sectional side view of the bonded structure of FIG. 4B after a third annealing process.

In the embodiment of FIGS. 4A-4C, however, additional anneal phases can be included. FIG. 4B is a schematic cross-sectional side view of the bonded structure 4*c* after a second annealing process. The second annealing process can include a rapid thermal process (RTP) and/or a non-RTP heating process. For example, the second annealing process can include the non-RTP heating process for a duration that is longer than a duration of the first annealing process, and/or another RTP phase. In the bonded structure 4*c*, the electrical connection between the first and second conductive features 22, 26 can be stronger, more reliable, and/or more durable than the bonded structure 4*b*. In some embodiments, during the second annealing process, the first and second conductive features 22, 26 can grow and interdiffuse to a greater degree, to form a larger bond interface for the conductive materials and larger grains compared to the RTP anneal phase alone.

After the second annealing process, at least a portion of the rapid growth structure 40 can remain as a rapid growth structure 40'. In other words, some of the grain configurations characteristic of RTP anneal can remain near the bond interface 18 of the conductive features 22, 26. In some embodiments, the rapid growth structure 40' can include a stress gradient and/or a gradient of interdiffused metal atoms. In some embodiments, the bonded structure 4*c* can be the final structure and the following step(s) (FIG. 4C) may be omitted.

FIG. 4C is a schematic cross-sectional side view of the bonded structure 4*d* after a third annealing process. In some embodiments, the third annealing process can be a continuation of the second annealing process. In some other embodiments, the third annealing process can include a separate annealing process from the second annealing process. Various examples of the first, second, and third annealing processes will be described with respect to FIGS. 6A-6F. It will of course be understood that, although 1-3 different anneal phases are illustrated and discussed, greater numbers of anneal phases can be included. After the third annealing process, at least a portion of the rapid growth structure 40' can remain as a rapid growth structure 40". In other words, some of the grain configurations characteristic of RTP anneal can remain near the bond interface 18 of the conductive features. In some embodiments, the rapid growth structure 40" can include a stress gradient and/or a gradient of interdiffused metal atoms.

Figure 5A:
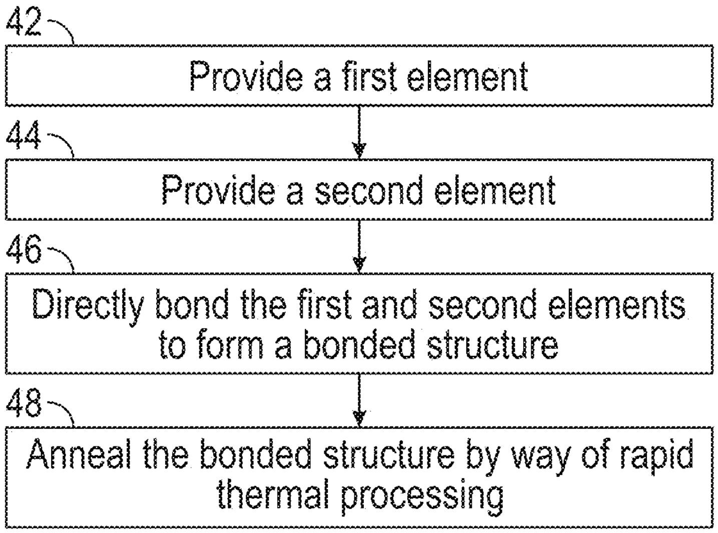
FIG. 5A is a flow chart showing a method of forming a bonded structure according to an embodiment.

FIG. 5A is a flow chart showing a method of forming a bonded structure according to an embodiment. At block 42, a first element can be provided. The first element can include a first non-conductive field region and a first conductive feature. The first element can be prepared for hybrid direct bonding, with a bonding layer including the first non-conductive field region and the first conductive feature, as well as planarization, activation and/or termination, as disclosed herein.

At block 44, a second element can be provided. The second element can include a second non-conductive field region and a second conductive feature. The second element can be prepared for hybrid direct bonding, with a bonding layer including the second non-conductive field region and the second conductive feature, as well as planarization, activation and/or termination, as disclosed herein.

At block 46, the first element and the second element can be directly bonded to one another to form a bonded structure. The first non-conductive field region is directly bonded to the second non-conductive field region without an intervening adhesive, and the first conductive feature is aligned with the second conductive feature. Alignment need not be perfect. In some embodiments, the bonded structure can be annealed at a low temperature to strengthen the nonconductive-to-nonconductive bond between the first non-conductive field region and the second non-conductive field region. The temperature of the low temperature anneal can be less than 200° C., or less than 150° C. At block 46, direct contact between the first and second conductive features are not formed.

At block 48, the bonded structure can be heated or annealed by way of an annealing process to form contact between the first and second conductive features. The annealing process can comprise a rapid thermal process (RTP). As described above, such RTP can be implemented by radiant heating. Including attendant overhead (substrate loading, purging, temperature ramping up, temperature ramping down, substrate unloading), the annealing process at block 48 can be in a range of 4 minute to 8 minutes. Excluding overhead, the actual high temperature plateau portion of the annealing process at block 48 may be, for example, less than 10 seconds, 7 seconds, 5 seconds, or 3 seconds for contact to be formed. The bonded structure can be annealed for a longer duration (e.g., 10 seconds to 20 minutes) for forming more contact between the first and second conductive features.

Figure 5B:
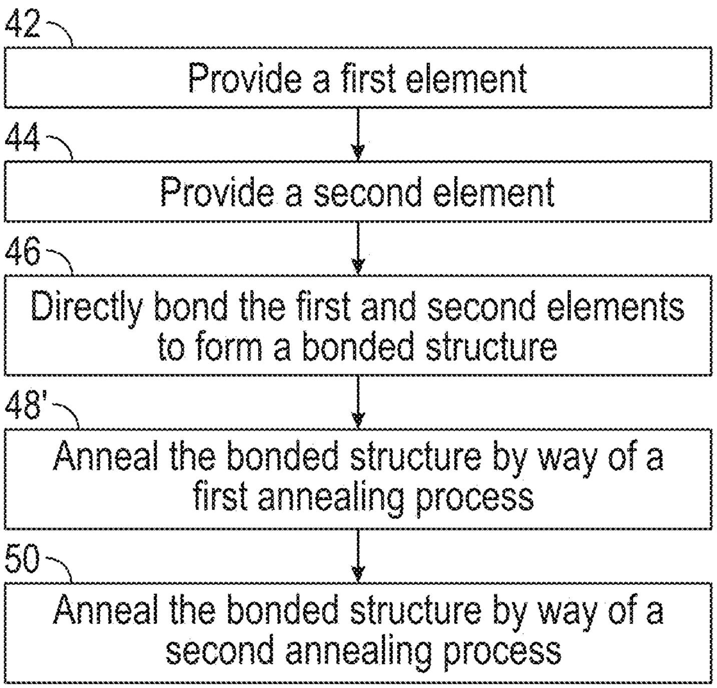
FIG. 5B is a flow chart showing another method of forming a bonded structure according to an embodiment.

FIG. 5B is a flow chart showing another method of forming a bonded structure according to an embodiment. Blocks 42-48' can be as described above with respect to blocks 42-48 in FIG. 5A. At block 50, the bonded structure can be heated or annealed by way of a second annealing process. The second annealing process can comprise a second RTP phase and/or a non-RTP heating phase. A non-RTP heating process for block 50 can include, for example, a convection heating process or a conduction heating process that does not use radiant energy for heating the bonded structure. A total duration of the second annealing process can be longer than a total duration of the first annealing process. The second annealing process can enable the conductive contact formed in the first annealing process to grow and form a more reliable electrical connection between the first and second conductive features. The methods of forming the bonded structure described with respect to FIGS. 5A-5B can be implemented in a wafer-to-wafer (W2 W) direct bonding, die-to-wafer (D2 W) direct bonding, and die-to-die (D2D) direct bonding. A total duration for forming the bonded structure, including the first and second annealing process can be in a range of 4 minutes to 120 minutes.

The RTP of the first annealing process 48 can enable the first and second conductive features to make contact relatively quickly. Without being limited to theory, the rapid growth structures 40 described above may facilitate early contact during anneal by RTP. The early contact between the first and second conductive features can reduce the duration of the second annealing process to make a desired final structure, including strengthened contact between conductive features and non-conductive features, compared to a process within the first annealing process 48. The first annealing process can enable the total duration of annealing process(es) to be shortened as compared to a conventional annealing process. Thus, various embodiments disclosed herein can enable manufacture of a bonded structure with a lower thermal budget than conventional methods.

Figure 6A:
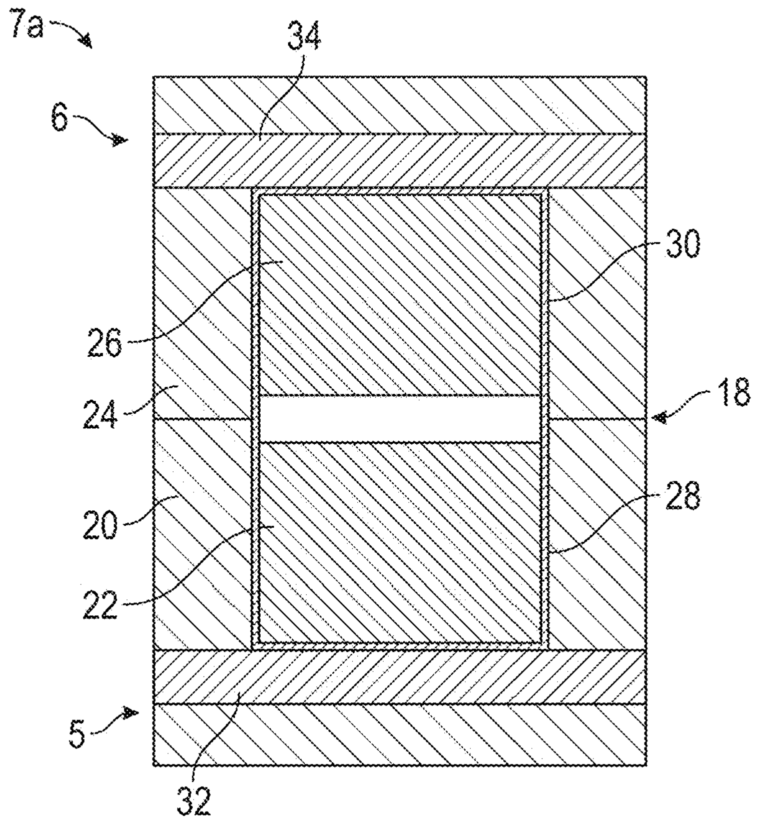
FIG. 6A is a schematic cross-sectional side view of a bonded structure prior to annealing.
Figure 6B:
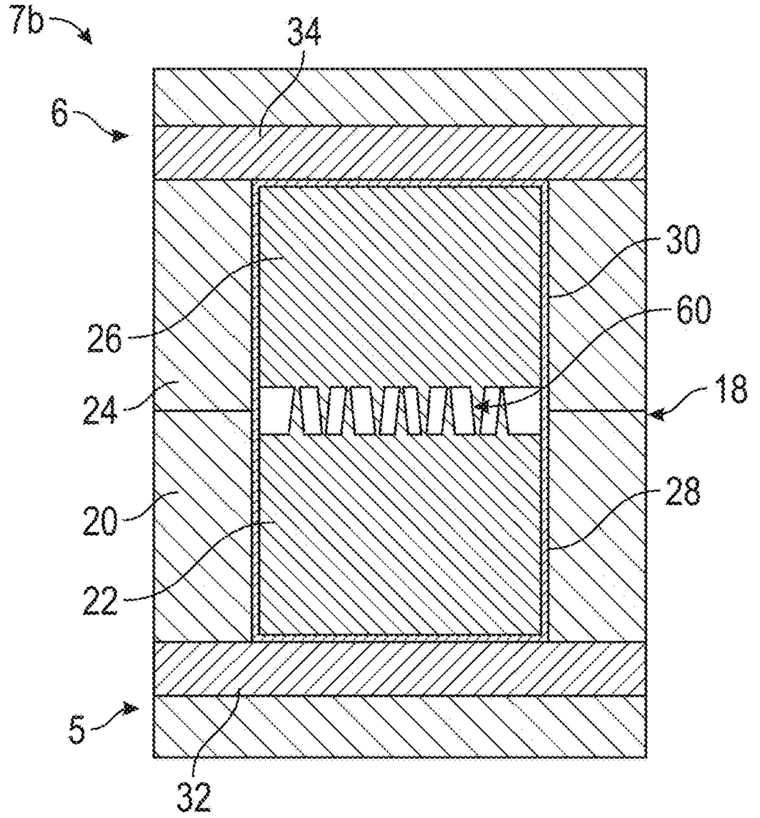
FIG. 6B is a schematic cross-sectional side view of the bonded structure after a first annealing process.
Figure 6C:
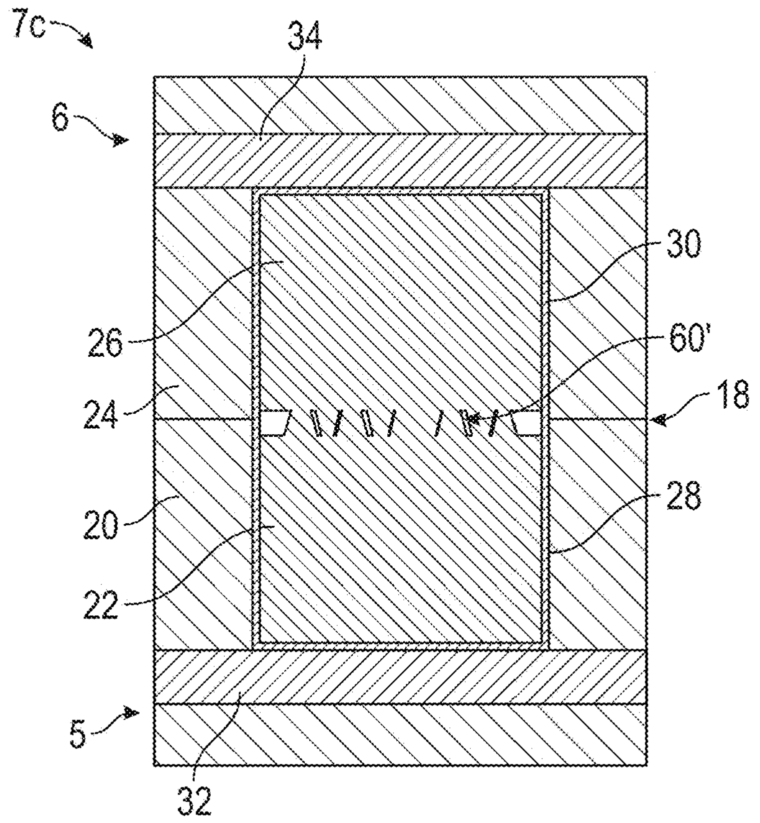
FIG. 6C is a schematic cross-sectional side view of the bonded structure after a second annealing process.
Figure 6D:
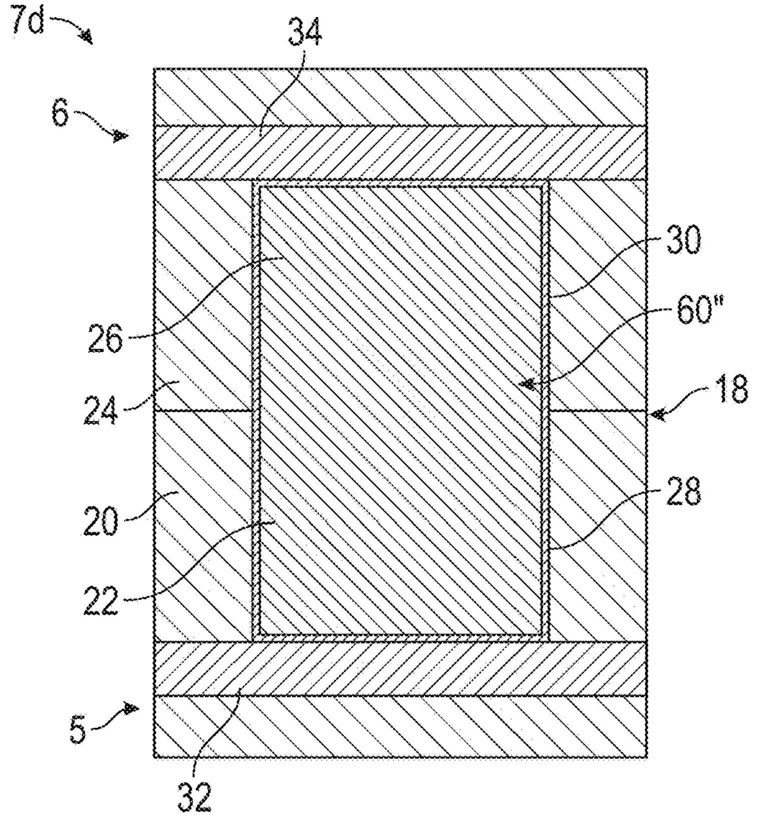
FIG. 6D is a schematic cross-sectional side view of the bonded structure after a third annealing process.

FIGS. 6A-6D show various steps in a process of annealing a bonded structure 7*a*-7*d* according to an embodiment. FIGS. 6A-6D are generally similar to FIGS. 3A-4C. FIGS. 6B and 6C illustrate extensions 60, 60' as examples of the rapid growth structures 40, 40' of FIGS. 4A and 4B.

The bonded structure 7*a* of FIG. 6A, which can be formed by room temperature contact without external pressure, can be subsequently annealed by way of an RTP to form an initial contact between the first and second conductive features 22, 26 as shown in FIG. 6B. As a result of the RTP, the extensions 60, such as localized spikes, can be formed at the bond interface 18 between the first and second conductive features 22, 26. In a subsequent second annealing process, the result of which is shown in FIG. 6C, the bonded first and second conductive features 22, 26 can grow and/or interdiffuse to define the extensions 60'. In some embodiments, the second annealing process can be a separate, longer conventional anneal (e.g., conductive or convective heating), in the same tool or in a different tool. In other embodiments, a more prolonged plateau in an RTP anneal may form the larger interface of the extensions 60'. In some embodiments, the extensions 60' may progress through diffusion to a rapid growth structure 60" shown in FIG. 6D through a third anneal or extension of the second anneal. Such extensions 60" may not be easily distinguished visually from merged conductors due to additional interdiffusion, but may nevertheless be present as a stress gradient and/or a gradient of interdiffused metal atoms in the bonded structure 7*d*. In other words, characteristic structures that result from the initial RTP treatment may still be detectible in microstructures, such as grain structure or compositional profiles, at the resultant interface 18 between the bonded conductive features 22, 26.

FIGS. 7A-7F show annealing temperatures and annealing times of various annealing processes. The various annealing processes of FIGS. 7A-7F can use the RTP with or without additional non-RTP heating processes as disclosed herein. Components shown in FIG. 3A-4C will be referred to for describing FIGS. 7A-7F.

Figure 7A:
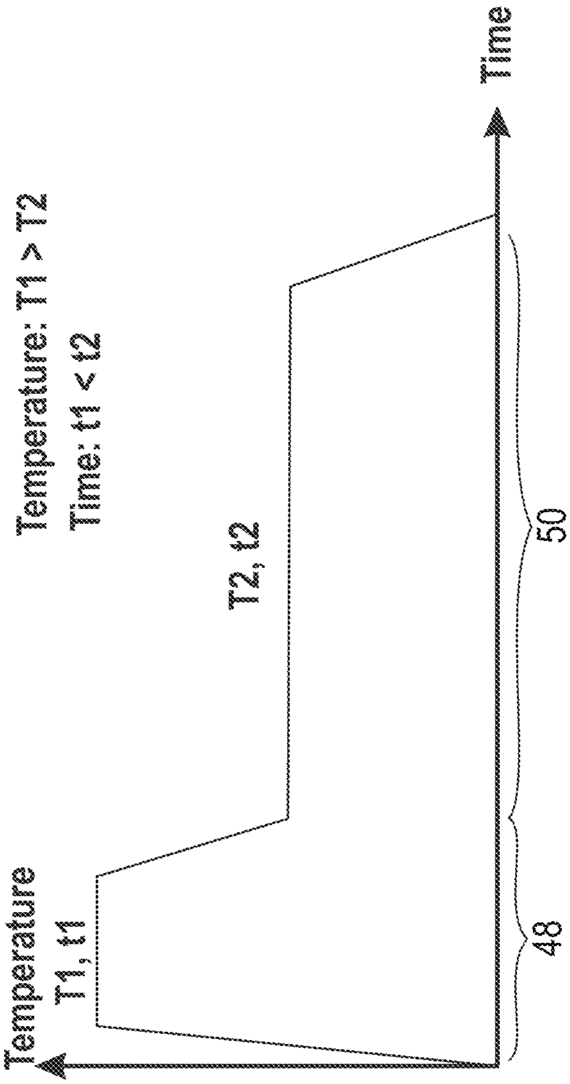
FIGS. 7A-7F show annealing temperatures and annealing times of various annealing processes.

FIG. 7A shows temperature and time in an annealing process that includes continuous first and second annealing processes 48, 50. For example, a system such as the heating system shown in FIG. 2B, or other tools with multiple heating mechanisms, can be used. The annealing process can include a short RTP heating process followed by a longer non-RTP heating process. The bonded structure 4*a*, formed, for example, by room temperature contact without external pressure between elements prepared for direct hybrid bonding, can be annealed at peak temperature T1 by way of the RTP for a duration of t1 that is sufficiently long to form an initial contact between the first and second conductive features 22, 26. For example, the duration t1 can be in a range of 0.5 seconds to 5 minutes, 1 second to 1 minute, or 1 second to 10 seconds. The peak temperature for the RTP phase (first anneal 48) can be between about 200° C. and 500° C., more particularly between about 250° C. and 400° C. Before and after the plateau for duration t1, the RTP phase also includes temperature ramp up and ramp down periods. The ramp up time may be between about 1 seconds and 20 seconds, more particularly between about 5 seconds and 10 seconds. The ramp down time may be between about 30 seconds and 300 seconds, more particularly between about 60 seconds and 180 seconds. The ramp rates during these portions of the RTP phase can be between about 10° C./second and 150° C./second, more particularly between about 15° C./second and 50° C./second. The ramp rate during temperature increase may be higher (e.g., 50-100° C./second) compared to during temperature decrease (e.g., 10-30° C./second). In some embodiments, a rapid growth structure, such as local grain extensions, can be formed by the first annealing process 48.

The bonded structure 4*b* can be annealed at peak temperature T2 by way of the non-RTP heating process (e.g., conductive or convective heating) for a duration of t2. The duration t2 can be greater than the duration t1. The duration t2 of the second anneal 50 can be between about 10 minutes and 180 minutes, more particularly between about 30 minutes and 120 minutes. The peak temperature for the non-RTP phase (second anneal 50) can be between about 120° C. and 300° C., more particularly between about 150° C. and 250° C.

Figure 7B:
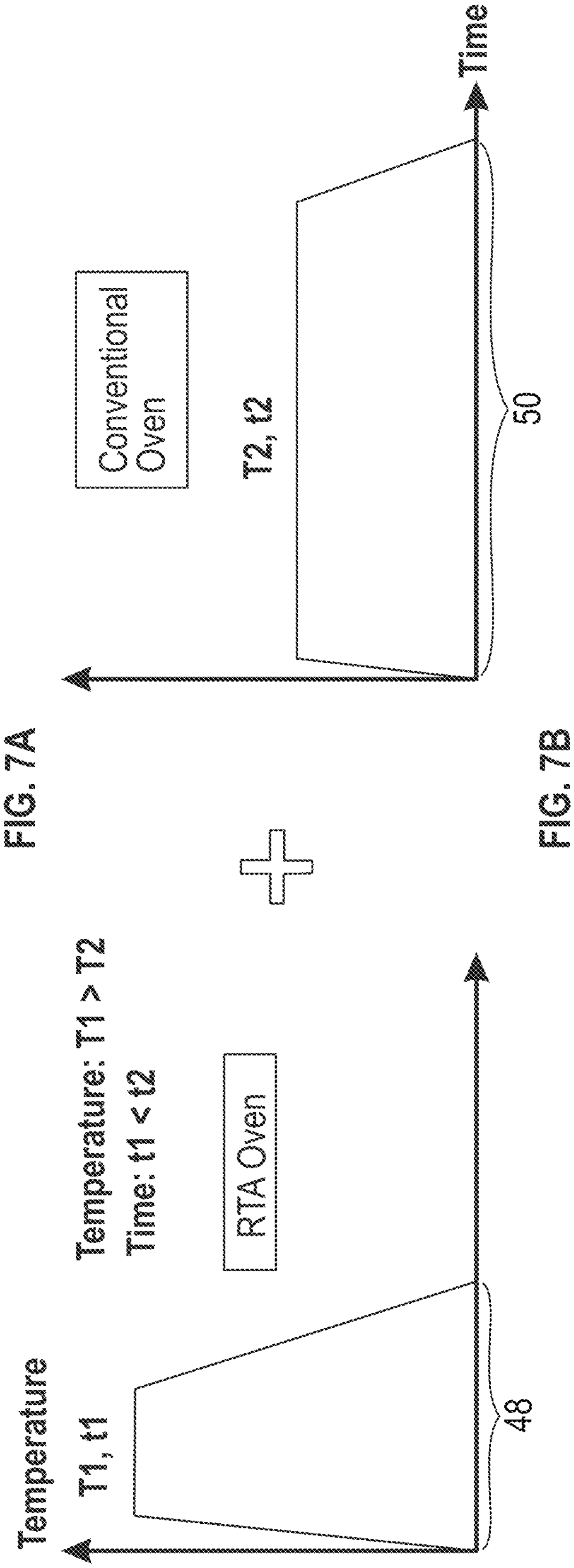

In FIG. 7B, the first and second processes 50 of FIG. 6A are separated, representing conducting the two anneals in separate tools with intervening transfer of the bonded structure 4*b*, 4*c*, or 4*d* (see FIGS. 4A-4C) after the first anneal, but can otherwise have durations, temperatures and ramp rates as described above.

Figure 7C:
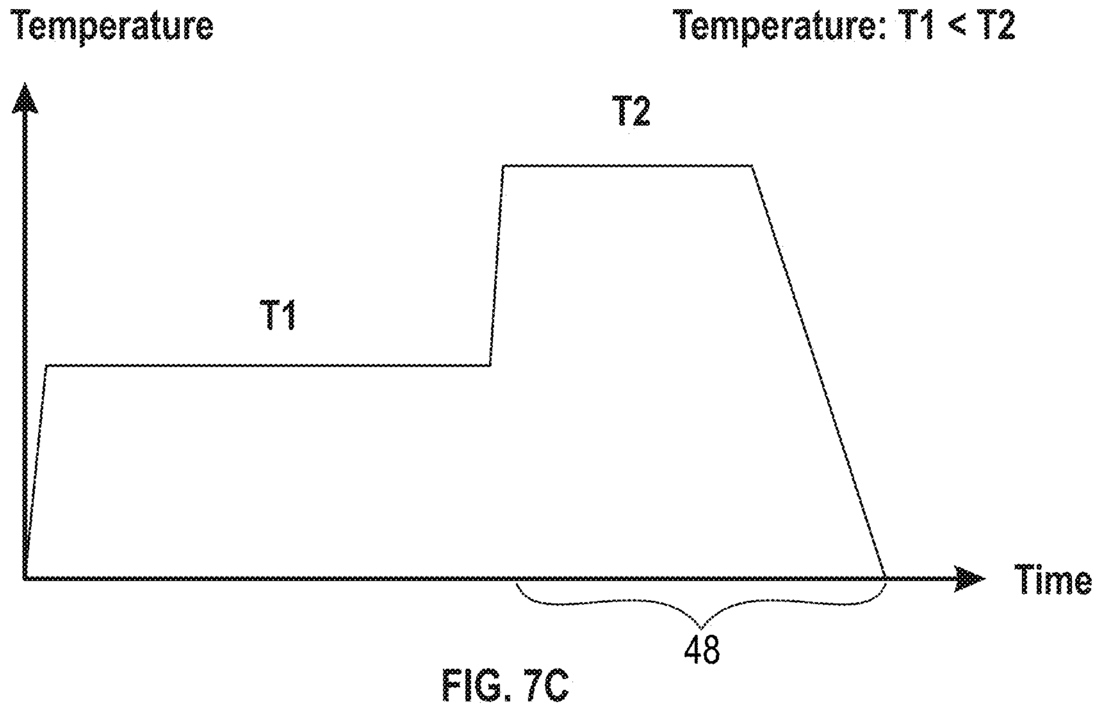

In FIG. 7C the bonded structure 4*a* can be pre-annealed at a low temperature T1, such as a temperature in a range between about 80° C. and 200° C., more particularly between about 120° C. and 180° C., and the first annealing process can follow. The pre-anneal can strengthen nonconductive-to-nonconductive bonding between the first and second non-conductive field regions 20, 24, relative to the bond formed at room temperature without external pressure. The first and second conductive features 22, 26 can be bonded to one another with a greater bond strength by the first annealing process, but the conductive features 22, 26 can remain separated as shown in FIG. 3A. The pre-anneal process can be conducted either in the RTP tool using radiant heating, or in a non-RTP zone or separate tool using, e.g., conductive or convective heating. The pre-anneal can have a duration between about 60 seconds and 1800 seconds, more particularly between about 300 seconds and 900 seconds. Subsequently the "first" anneal 48 process, using RTP, can be conducted. The first anneal 48 or RTP can be conducted with the durations, temperatures and ramp rates as described above with the exception that the initial temperature T1 at the beginning of the ramp up to T2 may be higher if both anneals are conducted in situ in the same tool.

Figure 7D:
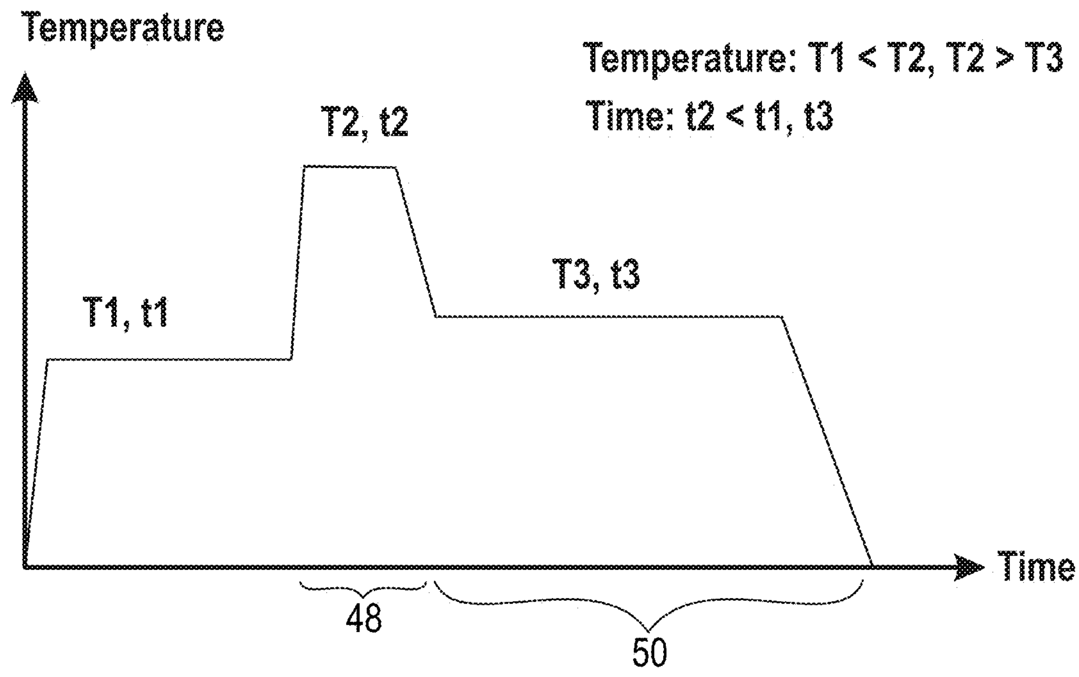

FIG. 7D is similar to FIG. 7C except that in FIG. 7D, the second annealing process 50 follows after the first annealing process 48 shown in FIG. 7C. In FIG. 7D, the bonded structure 4*a* can be pre-annealed at temperature T1 for a duration t1, and annealed by way of the RTP at peak temperature T2 for a duration of t2 that is shorter than the duration t1 to form the bonded structure 4*b*. The bonded structure 4*b* can be annealed by way of the non-RTP heating process (second anneal 50) at temperature T3 for a duration of t3 that is greater than the duration t2. T1, t1, T2, and t2 can be as described for FIG. 7C. T3, t3 can be as described above for T2, t2 with respect to FIG. 7A.

Figure 7E:
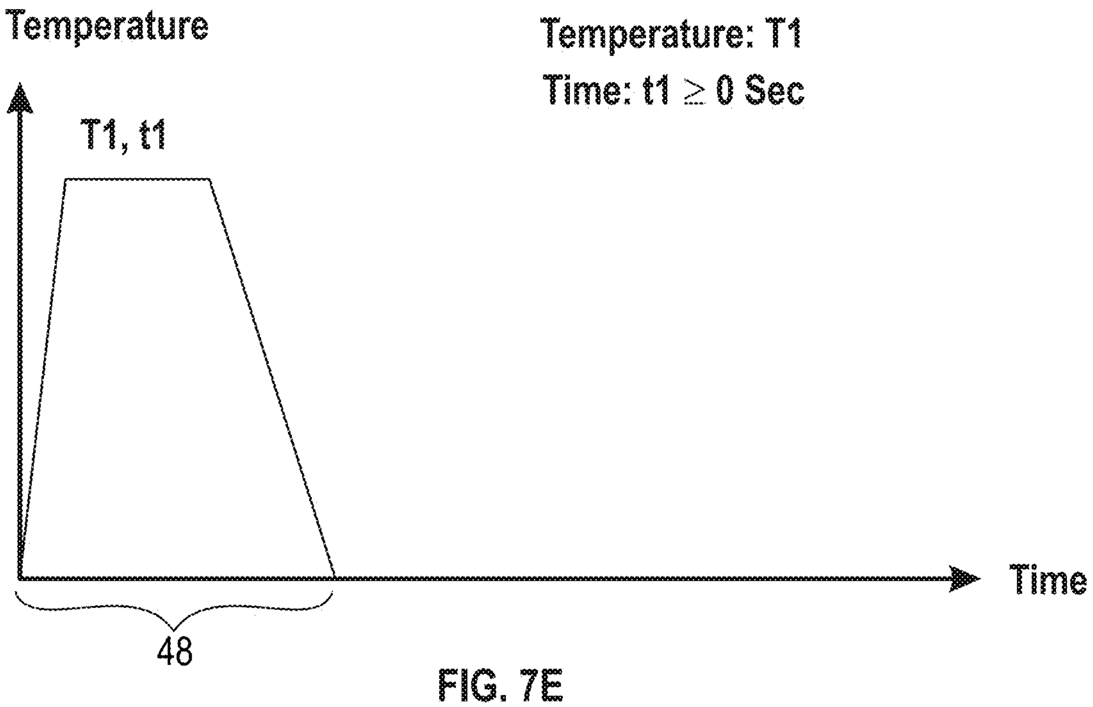

FIG. 7E is similar to FIG. 7C except that in FIG. 7E, the pre-anneal of FIG. 7C is omitted. In FIG. 7E, the first annealing process 48 comprises the RTP and no non-RTP anneal is employed. Instead, the short RTP is employed at peak temperature T1 for duration t1 that is a minimum required to reliably form electrical connections between corresponding conductive features 22, 26 for device requirements. The anneal 48 or RTP can be conducted with the durations, temperatures and ramp rates as described above with respect to FIG. 7A.

Figure 7F:
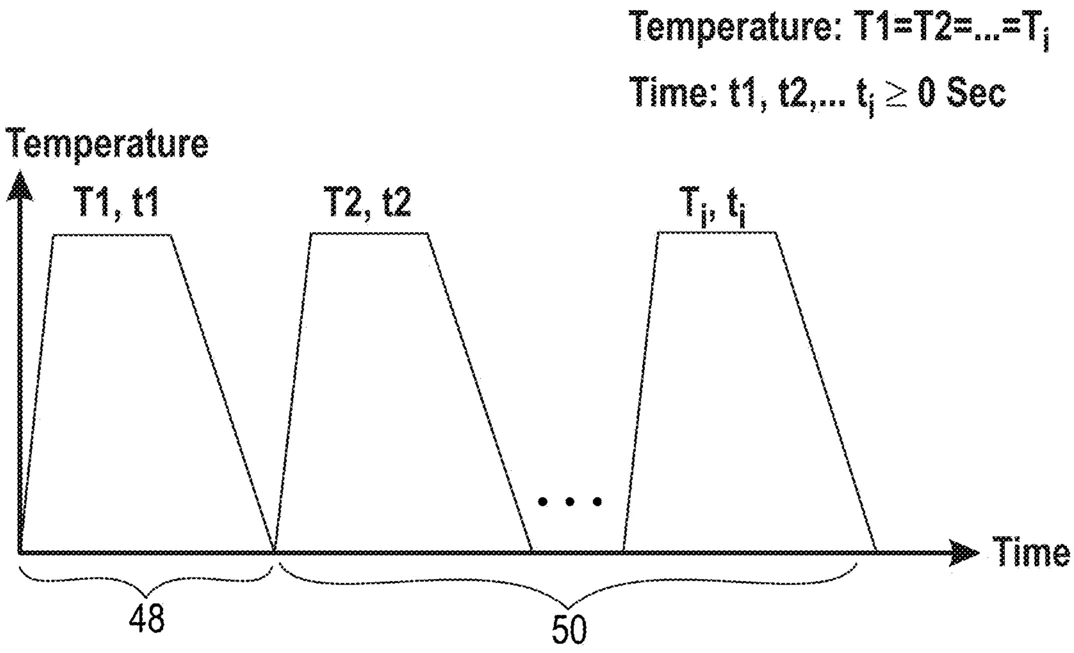
Figure 9A:
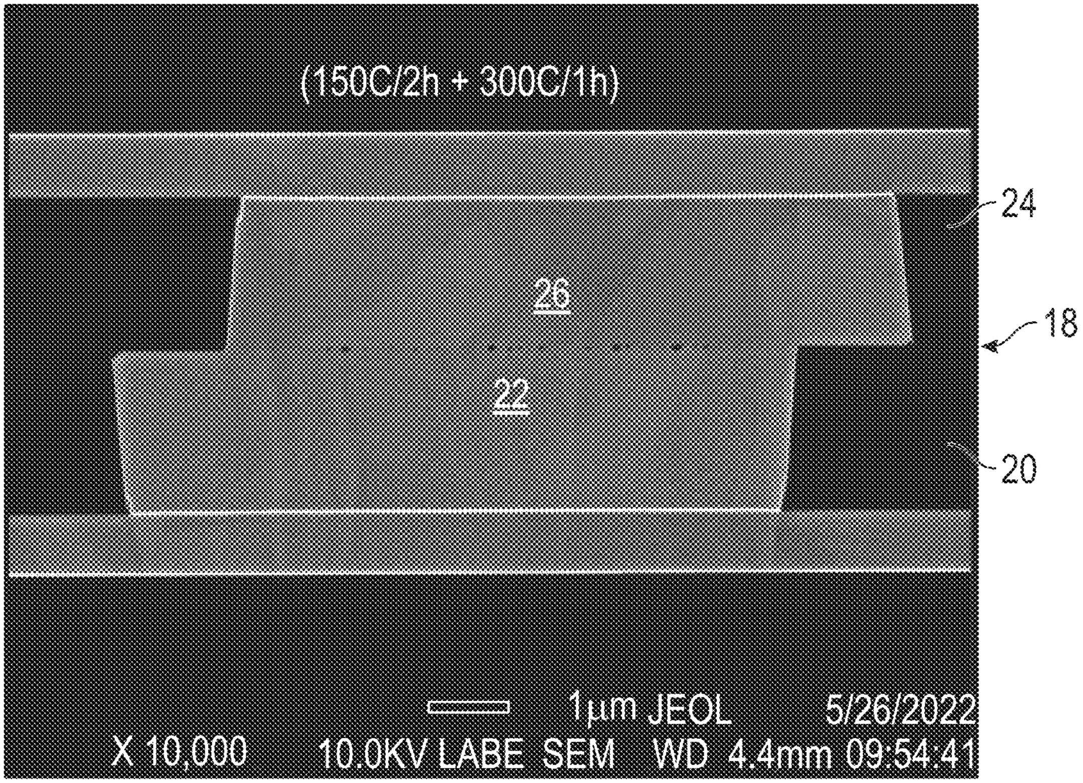
FIGS. 9A-9D illustrate micrographs of bonded elements at various stages of annealing to illustrate experimental results.
Figure 9B:
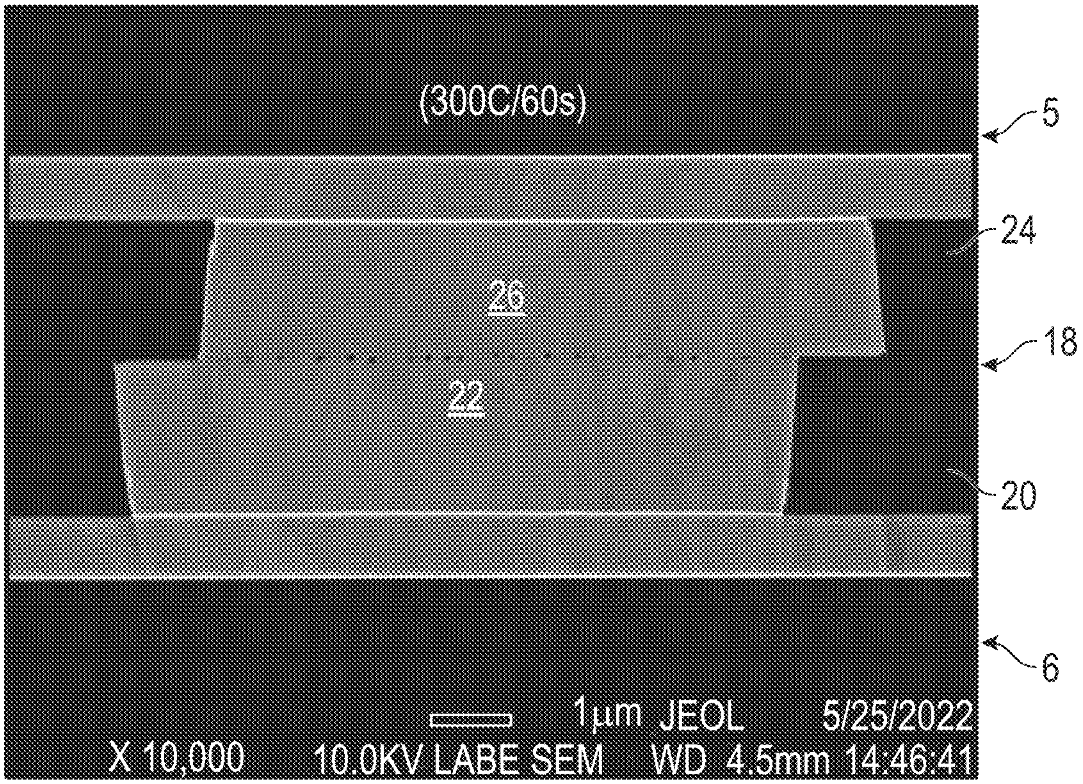
Figure 9C:
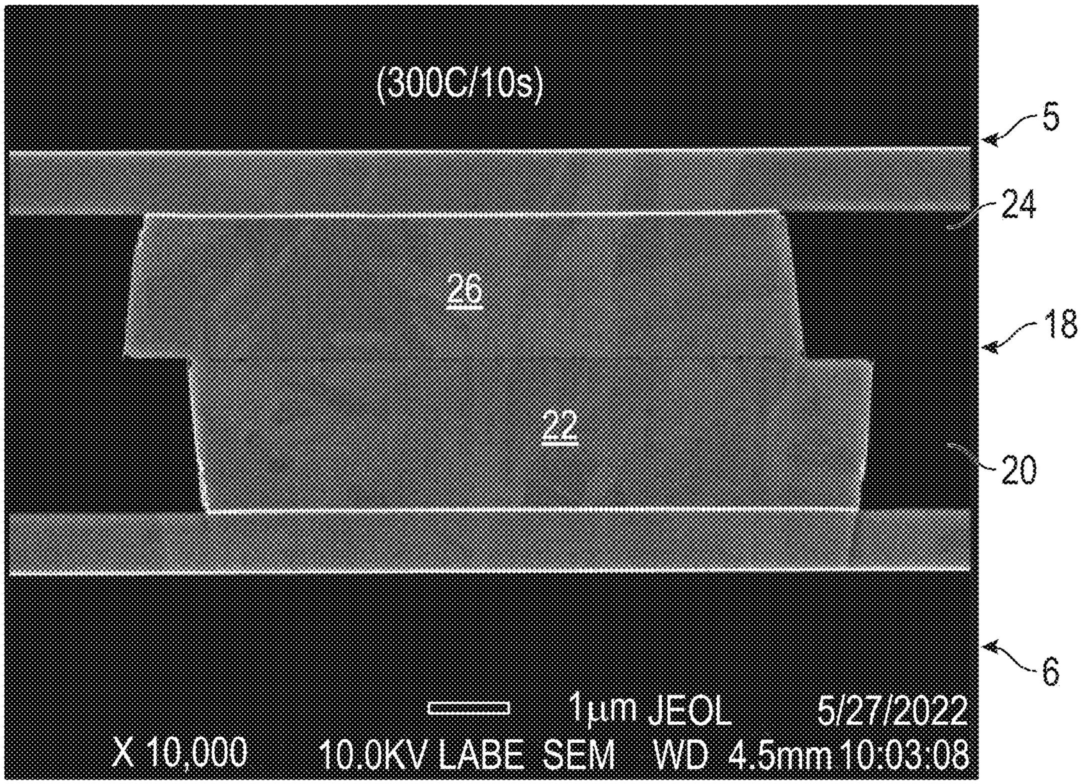
Figure 9D:
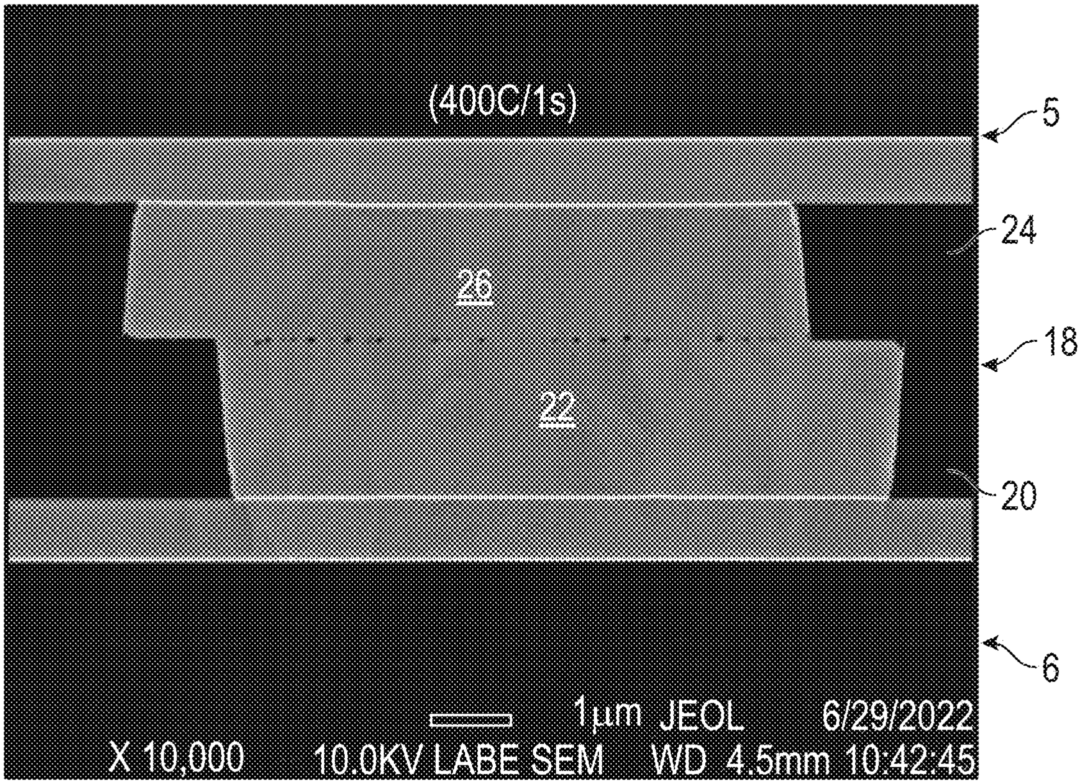

FIG. 7F shows a first annealing process that comprises the RTP followed by a second annealing process that comprises a plurality of RTPs. As described above, the first annealing process can form an initial contact between the first and second conductive features 22, 26, and the second annealing process can grow and/or interdiffuse the bonded first and second conductive features 22, 26, thereby improving electrical connection and bond interface quality. Rather than conductive and/or convective heating in subsequent anneals, the embodiment of FIG. 7F employs multiple pulses of RTP for the anneals to complete the bonds between conductive features 22, 26. Each pulse can have durations, temperatures and ramp rates as described above with respect to the first anneal 48 of FIG. 7A, or can each have different parameters as determined through routine experimentation in view of the teachings herein.

A suitable annealing process and a suitable annealing duration can be selected based at least in part on the materials and dimensions of various components of a bonded structure.

FIG. 8 is a chart showing experimental results indicating reliability of die-to-wafer (D2 W) bonded structures formed using four different annealing processes. The four annealing processes include (1) a convection heating for 120 minutes at 150° C. followed by a convection heating for 60 minutes at a peak temperature of 300° C.; (2) the RTP for 60 seconds at a peak temperature of 300° C., with a ramp-up rate of 100° C./min and a ramp-down rate of 20° C./min; (3) the RTP for 10 seconds with a peak temperature of 300° C., with a ramp-up rate of 25° C./s; and (4) the RTP for 1 second with a peak temperature of 400° C., with a ramp-up rate of 67° C./s and an active cooling using a nitrogen gas flow. The chart of FIG. 8 shows a sample size, electrical yield, a median resistance, a mean resistance, and a standard deviation of the measured resistances of the bonded structures. These results indicate that the RTP can achieve sufficient conductive-to-conductive connection in hybrid directly bonded structures. These results indicate that the RTP alone can make reliable electrical connections across the bonded structures, despite known issues with temperature uniformity with RTP. When combined with a conventional anneal, the RTP can enable considerable reduction in the overall anneal time while still forming more complete physical connections across the bonded structures.

FIGS. 9A-D show scanning electronic microscopy (SEM) images of four bonded structures formed in accordance with the four processes described above with respect to FIG. 8. The SEM images show that a reliable bonding along a bond interface 18 between first and second elements 5, 6 can be formed in a shorter time using the RTP as compared to using a conventional convection heating. The RTP quickly creates high density small connections (e.g., the extensions 60 as described herein) along the bond interface 18. In some embodiments, an additional thermal budget (e.g., a longer heating duration and/or a higher temperature) can result in coalescence of small voids at the bond interface 18 into larger but fewer voids.

A thermal treatment process can include a preparation process, an annealing process (e.g., one or more rapid thermal processes (RTPs) as disclosed herein), and a cooling process. For example, the preparation process can include loading a bonded structure (e.g., the bonded structure 4*a* shown in FIG. 3) into a thermal processing system. The preparation process may also include purging the system or chamber into which the bonded structure is loaded. In the annealing process, the bonded structure 4*a* can be annealed to form an annealed bonded structure (e.g., the bonded structure 4*b*, 4*c*, 4*d*, 7*a*, 7*b*, 7*c*, 7*d* of FIGS. 4A-4C, and 6A-6D). In the cooling process, the annealed bonded structure can be cooled prior to unloading to complete the thermal treatment process. In some embodiments, the cooling process can comprise active cooling.

Figure 10:
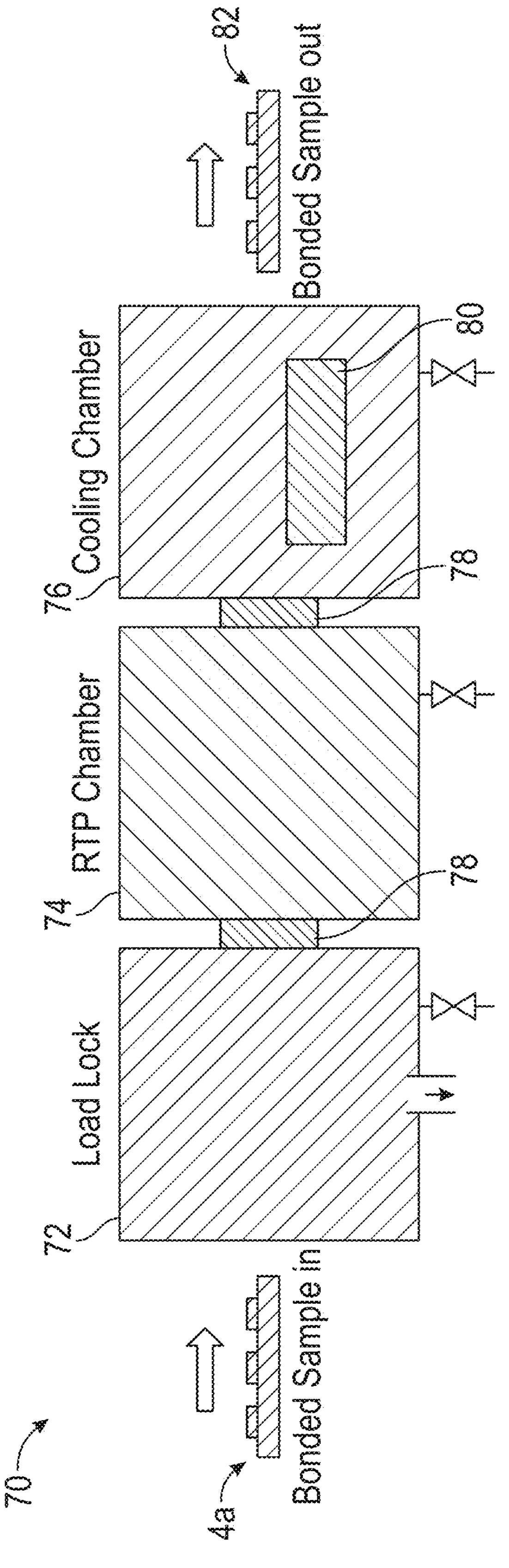
FIG. 10 schematically shows a thermal treatment system according to an embodiment.

FIG. 10 schematically shows an example thermal treatment system 70.

The thermal treatment system 70 can include a load lock 72, a rapid thermal process (RTP) chamber 74, and a cooling chamber 76. The load lock 72, the RTP chamber 74, and the cooling chamber 76 can be connected, for example, by isolation valves 78. A bonded structure 4*a* can be provided in the load lock 72 in a preparation process. After the preparation process, the bonded structure 4*a* can be provided in the RTP chamber 74 for annealing to provide an annealed bonded structure 82 (e.g., the bonded structure 4*b*, 4*c*, 4*d*, 7*a*, 7*b*, 7*c*, 7*d* of FIGS. 4A-4C, and 6A-6D). The annealed bonded structure 82 can be cooled in the cooling chamber 76.

In some embodiments, the load lock 72 can be a vacuum chamber. The load lock 72 can transfer the bonded structure 4*a* between two environments with different levels of cleanliness or atmospheric conditions. For example, the two environments can be the RTP chamber 74 and an outside environ of the RTP chamber 74. Implementing the load lock 72 can contribute to increasing throughput. In the load lock 72, the bonded structure 4*a* can be purged with, for example, an inert gas (e.g., nitrogen (N2)). Although shown as directly communicating with the RTP chamber 74, the skilled artisan will appreciate that the load lock 72 can communicate substrates through an isolatable transfer chamber, and that such a transfer chamber can directly communicate substrates (through gate valves) to each of the RTP chamber 74 and the cooling chamber 76, rather than directly connecting the two chambers 74, 76. Additionally, convective or conductive ovens can also be provided in a cluster tool to add multiple anneal phases to the process as described herein.

In the RTP chamber 74, any one or more of the annealing processes disclosed herein can be conducted. The annealing process(s) in the RTP chamber 74 can directly bond the first and second conductive features 22, 26 of the bonded structure 4*a* to be bonded, thereby creating a conductor-to-conductor direct bonding.

In some embodiments, the cooling chamber 76 can include an actively cooled chuck 80 that has a cooling mechanism integrated or coupled therewith. The annealed bonded structure 82 can be held by the actively cooled chuck 80 to reduce the temperature of the annealed bonded structure 82 to a desired temperature. In some embodiments, the annealed bonded structure 82 can be instead or additionally convectively cooled by way of purging in the cooling chamber 76. For example, the annealed bonded structure 82 can be purged with a cooled inert gas (e.g., nitrogen (N2)). The actively cooled chuck 80 and/or the purge cooling can enable the annealed bonded structure 82 to be cooled more quickly than natural or passive cooling, thereby reducing the thermal budget. The skilled artisan will appreciate that after cooling the annealed bonded structure 82 can be unloaded through a separate isolation valve, or back through the load lock chamber 72 (by way of the intervening RTP chamber 78, or through any intervening transfer chamber).

Figure 11A:
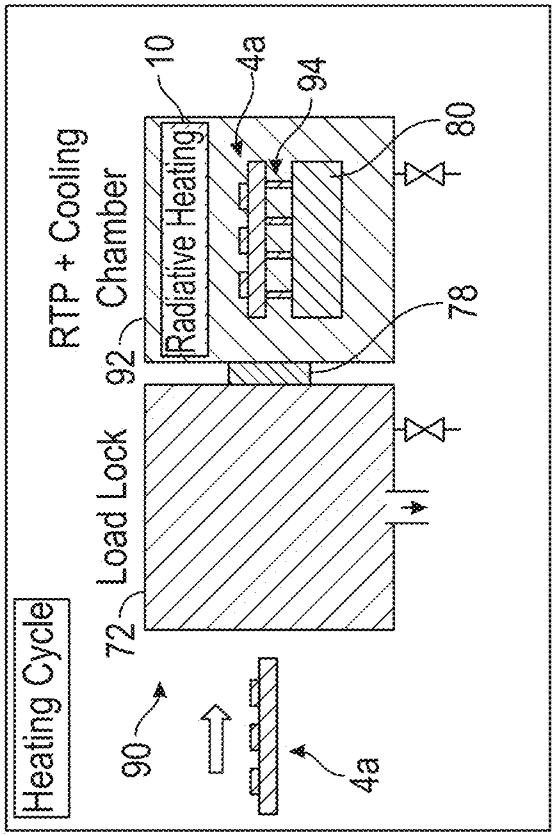
FIG. 11A schematically shows a thermal treatment system according to another embodiment in a first state (a heating cycle).
Figure 11B:
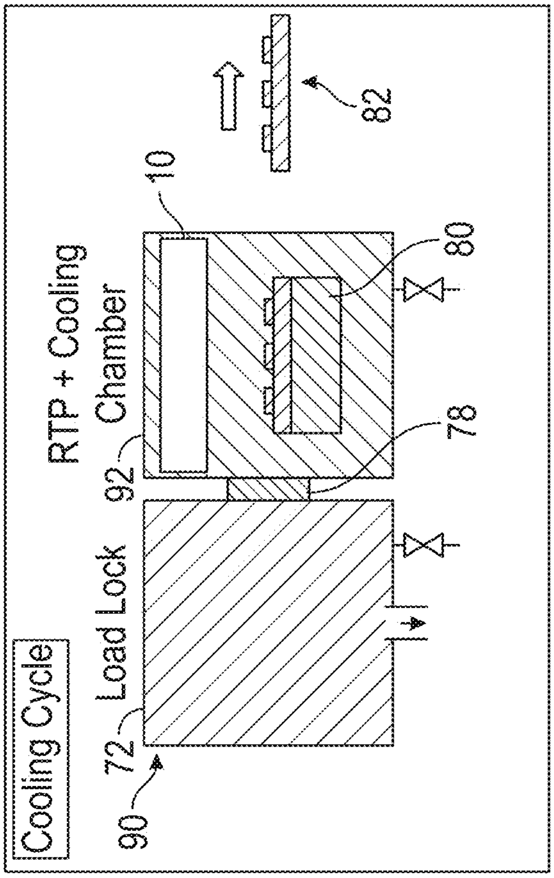
FIG. 11B shows the thermal treatment system of FIG. 11A in a second state (a cooling cycle).

FIG. 11A shows a thermal treatment system 90 in a first state (a heating cycle). FIG. 11B shows the thermal treatment system 90 in a second state (a cooling cycle). The thermal treatment system 90 can include a load lock 72 and an annealing chamber 92. The load lock 72 and the annealing chamber 92 can be connected, for example, by an isolation valve 78, and can also include an intervening transfer chamber for more complex cluster tools. The annealing chamber 92 can function as both the RTP chamber 74 and the cooling chamber 76 shown in FIG. 10.

The annealing chamber 92 can include a heat source 10 (e.g., lamps or laser sources as described above), and a cooling mechanism (e.g., the actively cooled chuck 80). In the first state (the heating cycle), the bonded structure 4*a* can be spaced apart from the actively cooled chuck 80 by way of, for example, pins 94 or pillars that can extend between the actively cooled chick 80 and the bonded structure 4*a*. In the second state (the cooling cycle), the bonded structure 4*a* can be closer to (e.g., in contact with) the actively cooled chuck 80. The pins 94 can lift and descend the bonded structure 4*a* relative to the actively cooled chuck 80. The load lock 72 and the annealing chamber 92 can contribute to increasing throughput, and the active cooling mechanism (e.g., the actively cooled chuck 80) and/or the purge cooling can enable the annealed bonded structure 82 to be cooled more quickly than natural or passive cooling, thereby reducing the thermal budget. The purge cooling as described with respect to FIG. 10 may be employed in place of or in addition to the actively cooled chuck 80. As also noted with respect to FIG. 10, the annealed bonded structure 82 can be unloaded by way of the load lock 72 and any intervening chamber.

In one aspect, a method of forming a bonded structure is disclosed. The method includes providing a first element including a first non-conductive field region and a first conductive feature, and directly bonding the first element to a second element. The second element includes a second non-conductive field region and a second conductive feature such that the first non-conductive field region is directly bonded to the second non-conductive field region without an intervening adhesive. The first conductive feature is aligned with the second conductive feature. The method also includes, after directly bonding the first element to the second element, annealing the first and second elements by way of rapid thermal process.

In some embodiments, after directly bonding the first element to the second element and before annealing the first and second elements by way of rapid thermal process, the first and second conductive features are spaced by a gap. The gap between the first and second conductive features can be bridged by expansion of the first and second conductive features due to the rapid thermal process. The method can further include annealing the first and second elements by way of a convection or conduction heating process to strengthen a bonding strength between the first non-conductive field region and the second non-conductive field region prior to annealing the first and second elements by way of rapid thermal process. The method can further include annealing the first and second elements by way of a convection or conduction heating process after electrically connecting the first and second conductive features for a duration that is longer than a duration of the rapid thermal process.

In one embodiment, annealing the first and second elements by way of rapid thermal process includes forming a rapid growth structure connecting the first conductive feature to the second conductive feature in multiple locations.

In some embodiments, the rapid thermal process includes heating the bonded first and second elements by way of a radiant energy source. The radiant energy source can include radiant heat lamps. The radiant heat lamps can include infrared halogen lamps.

In some embodiments, the first element further includes a first device portion and the second element further includes a second device portion. The first device portion can include an optoelectronic single crystal material. The second device portion can include silicon (Si), quartz, fused silica glass, sapphire, or a glass. The first device portion can include lithium tantalate ($LiTaO_3$) or lithium niobate ($LiNbO_3$).

In one embodiment, the method further includes, after directly bonding the first element to the second element and prior to annealing the first and second elements, providing the first and second elements in a load lock.

In one embodiment, the method further includes, after annealing the first and second elements, actively cooling the first and second elements.

In another aspect, a method of direct bonding is disclosed. The method includes directly bonding non-conductive regions of a first element to non-conductive regions of a second element to form a bonded structure. The method includes, after directly bonding the non-conductive regions, annealing the bonded structure to bridge a gap between aligned conductive features of the first element and the second element in the bonded structure. Annealing includes exposing the bonded structure to radiant heating.

In one embodiment, the method further includes polishing a bonding surface of the first element to have a surface roughness in a range of 1 Å rms to 15 Å rms.

In one embodiment, annealing the bonded structure further includes exposing the bonded structure to a convection or conduction heating process prior to exposing the bonded structure to radiant heating.

In one embodiment, annealing the bonded structure further includes exposing the bonded structure to a convection or conduction heating process after exposing the bonded structure to the radiant heating. Exposing to the convection or conduction heating process can be conducted for a duration that is longer than a duration of exposing to the radiant heating at a temperature that can be lower than a peak temperature of the bonded structure during exposing to the radiant heating.

In one embodiment, exposing the bonded structure to the radiant heating includes forming extensions between the aligned first and second conductive features of the first and second elements.

In some embodiments, annealing the bonded structure includes annealing the bonded structure for a duration in a range of 0.5 seconds to 5 minutes at a maximum temperature in a range of 200° C. to 500° C. A ramp up rate during exposing the bonded structure to radiant heating before reaching the maximum temperature can be in a range of 10° C. per second to 150° C. per second.

In one embodiment, a majority of the first element includes a first material having a first coefficient of thermal expansion and a majority of the second element includes a second material having a second coefficient of thermal expansion that is at least 5 ppm different from the first coefficient of thermal expansion.

In another aspect, a method of forming a bonded structure is disclosed. The method includes providing a first element including a first surface dielectric region and surface metal region, and directly bonding the first element to a second element. The second element includes a second surface dielectric region and a second surface metal region such that the first surface dielectric region is directly bonded to the second surface dielectric region without an intervening adhesive. The first surface metal region is aligned with the second surface metal region. The method also includes, after directly bonding the first element to the second element, annealing the first and second elements by way of an annealing process thereby providing a conductive contact between the first and second surface metal regions. The annealing process includes a phase with a ramp up rate in a range of about 10° C. per second to 150° C. per second.

In one aspect, a bonded structure is disclosed. The bonded structure includes a first element including a first non-conductive field region and a first conductive feature. The bonded structure includes a second element including a second non-conductive field region and a second conductive feature. The second element is directly bonded to the first element along a bond interface such that the first non-conductive field region is directly bonded to the second non-conductive field region without an intervening adhesive. The first conductive feature is directly bonded to the second conductive feature without an intervening adhesive. The bond interface between the first and second conductive features includes a rapid growth structure indicative of annealing by a rapid thermal process.

In one embodiment, the rapid growth structure includes a plurality of grain extensions between the first and second conductive features.

In one embodiment, the rapid growth structure includes a stress gradient and/or a gradient of interdiffused metal atoms.

In some embodiments, the first element is a wafer or a die. The second element can be a wafer or a die.

In one embodiment, the first element further includes a first device portion and the second element includes a second device portion. The first device portion can include a first material having a first coefficient of thermal expansion and the second device portion can include a second material having a second coefficient of thermal expansion that is at least 5 ppm different from the first coefficient of thermal expansion.

Unless the context clearly requires otherwise, throughout the description and the claims, the words "comprise," "comprising," "include," "including" and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of the various embodiments described above can be combined to provide further embodiments. The accompanying claims and their equivalents are intended to cover such forms or modifications as would fall within the scope and spirit of the disclosure.

What is claimed is:

1. A method of forming a bonded structure, the method comprising:

providing a first element including a first non-conductive field region and a first conductive feature;

directly bonding the first element to a second element, the second element including a second non-conductive field region and a second conductive feature, such that the first non-conductive field region is directly bonded to the second non-conductive field region without an intervening adhesive, and the first conductive feature is aligned with the second conductive feature; and after directly bonding the first element to the second element, annealing the first and second elements by way of rapid thermal process, the rapid thermal process comprising heating the bonded first and second elements by way of a radiant energy source.

2. The method of claim 1, wherein after directly bonding the first element to the second element and before annealing the first and second elements by way of rapid thermal process, the first and second conductive features are spaced by a gap.

3. The method of claim 2, wherein the gap between the first and second conductive features is bridged by expansion of the first and second conductive features due to the rapid thermal process.

4. The method of claim 3, further comprising annealing the first and second elements by way of a convection or conduction heating process to strengthen a bonding strength between the first non-conductive field region and the second non-conductive field region prior to annealing the first and second elements by way of rapid thermal process.

5. The method of claim 3, further comprising annealing the first and second elements by way of a convection or conduction heating process after electrically connecting the first and second conductive features for a duration that is longer than a duration of the rapid thermal process.

6. The method of claim 1, wherein annealing the first and second elements by way of rapid thermal process comprises forming a rapid growth structure connecting the first conductive feature to the second conductive feature in multiple locations.

7. The method of claim 1, wherein the radiant energy source comprises radiant heat lamps.

8. The method of claim 1, wherein the first element further comprises a first device portion and the second element further comprises a second device portion, the first device portion including an optoelectronic single crystal material, and the second device portion including silicon (Si), quartz, fused silica glass, sapphire, or a glass.

9. The method of claim 1, further comprising, after directly bonding the first element to the second element and prior to annealing the first and second elements, providing the first and second elements in a load lock, and after annealing the first and second elements, actively cooling the first and second elements.

10. A method of direct bonding, the method comprising:

directly bonding non-conductive regions of a first element to non-conductive regions of a second element to form a bonded structure; and after directly bonding the non-conductive regions, annealing the bonded structure to bridge a gap between aligned conductive features of the first element and the second element in the bonded structure, wherein annealing comprises exposing the bonded structure to radiant heating.

11. The method of claim 10, wherein annealing the bonded structure further comprises exposing the bonded structure to a convection or conduction heating process prior to exposing the bonded structure to radiant heating.

12. The method of claim 10, wherein annealing the bonded structure further comprises exposing the bonded structure to a convection or conduction heating process after exposing the bonded structure to the radiant heating, wherein exposing to the convection or conduction heating process is conducted for a duration that is longer than a duration of exposing to the radiant heating at a temperature that is lower than a peak temperature of the bonded structure during exposing to the radiant heating.

13. The method of claim 10, wherein exposing the bonded structure to the radiant heating comprises forming extensions between the aligned first and second conductive features of the first and second elements.

14. The method of claim 10, wherein annealing the bonded structure comprises annealing the bonded structure for a duration in a range of 0.5 seconds to 5 minutes at a maximum temperature in a range of 200° C. to 500° C.

15. The method of claim 14, wherein a ramp up rate during exposing the bonded structure to radiant heating before reaching the maximum temperature is in a range of 10° C. per second to 150° C. per second.

16. A bonded structure, comprising:

a first element including a first non-conductive field region and a first conductive feature; and a second element including a second non-conductive field region and a second conductive feature, the second element directly bonded to the first element along a bond interface such that the first non-conductive field region is directly bonded to the second non-conductive field region without an intervening adhesive, and the first conductive feature is directly bonded to the second conductive feature without an intervening adhesive, wherein the bond interface between the first and second conductive features comprises a rapid growth structure indicative of annealing by a rapid thermal process by way of a radiant energy source.

17. The bonded structure of claim 16, wherein the rapid growth structure comprises a plurality of grain extensions between the first and second conductive features.

18. The bonded structure of claim 16, wherein the first element is a wafer or a die, and the second element is a wafer or a die.

19. The bonded structure of claim 16, wherein the first element further comprises a first device portion and the second element further comprises a second device portion, the first device portion comprises a first material having a first coefficient of thermal expansion and the second device portion comprises a second material having a second coefficient of thermal expansion that is at least 5 ppm different from the first coefficient of thermal expansion.

20. The bonded structure of claim 16, wherein the rapid growth structure comprises a stress gradient and/or a gradient of interdiffused metal atoms.

* * * * *